US010930726B2

(12) United States Patent
Wang et al.

(10) Patent No.: US 10,930,726 B2
(45) Date of Patent: Feb. 23, 2021

(54) DISPLAY SUBSTRATE AND PREPARATION METHOD THEREOF, DISPLAY PANEL, AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Qinghe Wang, Beijing (CN); Liangchen Yan, Beijing (CN); Dongfang Wang, Beijing (CN); Tongshang Su, Beijing (CN); Jun Wang, Beijing (CN); Guangyao Li, Beijing (CN); Yang Zhang, Beijing (CN); Xuechao Sun, Beijing (CN)

(73) Assignees: Hefei Xinsheng Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 64 days.

(21) Appl. No.: 16/245,341

(22) Filed: Jan. 11, 2019

(65) Prior Publication Data
US 2019/0371875 A1 Dec. 5, 2019

(30) Foreign Application Priority Data

May 31, 2018 (CN) .......................... 201810546928.8

(51) Int. Cl.
*H01L 51/50* (2006.01)
*H01L 27/32* (2006.01)
(Continued)

(52) U.S. Cl.
CPC ...... *H01L 27/3274* (2013.01); *H01L 27/3262* (2013.01); *H01L 27/3276* (2013.01);
(Continued)

(58) Field of Classification Search
CPC ............ H01L 51/0558; H01L 51/5012; H01L 2227/323; H01L 2251/5338;
(Continued)

(56) References Cited

U.S. PATENT DOCUMENTS 9,455,421 B2 * 9/2016 Li ........................... H01L 33/52
9,859,530 B2 * 1/2018 Tanaka ................ H01L 51/0545
(Continued)

FOREIGN PATENT DOCUMENTS

CN 1875496 A 12/2006
CN 105679949 A 6/2016
(Continued)

OTHER PUBLICATIONS

Endoh et al. IEEE Polytronic 2007 Conference (Year: 2007).*
(Continued)

*Primary Examiner* — Jarrett J Stark
(74) *Attorney, Agent, or Firm* — Fay Sharpe LLP

(57) ABSTRACT

Provided are a display substrate and a preparation method thereof, a display panel, and a display device. The display substrate includes a substrate and a plurality of pixel units on the substrate. The pixel unit comprises a plurality of functional layers that are sequentially arranged in a direction away from the substrate. At least one of the plurality of functional layers, which is close to the substrate, constitutes a vertical thin film transistor (VTFT). At least one of the plurality of functional layers, which is away from the substrate, constitutes an organic light-emitting transistor (OLET). An orthographic projection region of the OLET on the substrate and an orthographic projection region of the VTFT on the substrate at least partially overlap.

16 Claims, 17 Drawing Sheets

(51) Int. Cl.
*H01L 51/05* (2006.01)
*H01L 51/52* (2006.01)
*H01L 51/56* (2006.01)
*H01L 51/00* (2006.01)

(52) U.S. Cl.
CPC .......... *H01L 51/052* (2013.01); *H01L 51/057* (2013.01); *H01L 51/5296* (2013.01); *H01L 51/56* (2013.01); *H01L 51/0053* (2013.01); *H01L 51/0055* (2013.01); *H01L 51/0074* (2013.01); *H01L 51/0081* (2013.01); *H01L 51/0558* (2013.01); *H01L 51/5012* (2013.01); *H01L 2227/323* (2013.01); *H01L 2251/5338* (2013.01); *H01L 2251/558* (2013.01)

(58) Field of Classification Search
CPC ........... H01L 2251/558; H01L 27/3274; H01L 27/3262; H01L 27/3276; H01L 51/052; H01L 51/057; H01L 51/5296; H01L 51/56
See application file for complete search history.

(56) References Cited

U.S. PATENT DOCUMENTS

| | | | |
|---|---|---|---|
| 2010/0096621 A1* | 4/2010 | Chuman | H01L 51/0012 257/40 |
| 2013/0240842 A1* | 9/2013 | Rinzler | H01L 51/5296 257/40 |
| 2014/0299852 A1* | 10/2014 | Hong | H01L 27/3274 257/40 |
| 2017/0192354 A1* | 7/2017 | Zhao | G03F 7/38 |
| 2017/0250238 A1* | 8/2017 | Muccini | H01L 51/5271 |
| 2018/0047851 A1* | 2/2018 | Yan | H01L 29/78642 |

FOREIGN PATENT DOCUMENTS

| | | | |
|---|---|---|---|
| CN | 107112347 A | 8/2017 | |
| EP | 3327815 A1 * | 5/2018 | ......... H01L 51/5296 |
| JP | 2011187924 A | 9/2011 | |

OTHER PUBLICATIONS

Capelli et al. Nature Matterials, vol. 9 Jun. 2010 (Year: 2010).*
Chaudhry et al. Adv. Funct. Mater. 2020, 30, 1905282 (Year: 2020).*
Yamauchi et al. Japanese Journal fo Applied Physics vol. 46 No. 4B 2007, pp. 2673-2682 (Year: 2007).*
Xu et al. Appllied Physics Letters 91, 092911 2007 (Year: 2007).*
Seo et al. Adv. Funct. Mater., 21: 3667-3672. (Year: 2011).*
Oh et al. Molecular Crystals and Liquid Crystals, Dec. 21, 2006, vol. 458, No. 1, pp. 247-254 (Year: 2006).*
Hsieh et al. SID Symposium Digest of Technical Papers, 47, doi: 10.1002/sdtp.10744. (Year: 2016).*
Kudo, Kazuhiro (Electronics and Mechanical Engineering, Chiba University Published : Aug. 27, 2007 (Year: 2007).*
First office action of Chinese application No. 201810546928.8 dated May 8, 2020.

* cited by examiner

DISPLAY SUBSTRATE AND PREPARATION METHOD THEREOF, DISPLAY PANEL, AND DISPLAY DEVICE

CROSS-REFERENCE TO RELATED APPLICATION

The present disclosure claims priority to Chinese Patent Application No. 201810546928.8, filed on May 31, 2018 and titled "DISPLAY SUBSTRATE AND PREPARATION METHOD THEREOF, AND DISPLAY DEVICE", which is incorporated herein by reference in its entirety.

TECHNICAL FIELD

The present disclosure relates to a display substrate and a preparation method thereof, a display panel, and a display device.

BACKGROUND

With the development of science and technology, display substrates are used more and more widely, such as an Organic Light-Emitting Diode (OLED) display substrate. The OLED display substrate generally includes a substrate and a plurality of pixel units disposed on the substrate. Each pixel unit includes a thin film transistor (TFT) and an OLED that are sequentially arranged in a direction away from the substrate.

SUMMARY

In an aspect, at least one embodiment of the present disclosure provides a display substrate, comprising a substrate and a plurality of pixel units on the substrate; wherein the pixel unit comprises a plurality of functional layers that are sequentially arranged in a direction away from the substrate, at least one of the plurality of functional layers, which is close to the substrate, constitutes a vertical thin film transistor (VTFT), at least one of the plurality of functional layers, which is away from the substrate, constitutes an organic light-emitting transistor (OLET), and an orthographic projection region of the OLET on the substrate and an orthographic projection region of the VTFT on the substrate at least partially overlap.

In some embodiments, the plurality of functional layers comprise a gate layer, a first insulating layer, a first electrode layer, a bottom semiconductor material layer, a second electrode layer, a second insulating layer, a first semiconductor material layer, an electroluminescent layer, a second semiconductor material layer, and a source-drain pattern that are sequentially arranged in a direction away from the substrate, the source-drain pattern comprising a source and a drain, and at least one of the source and the drain covers side surfaces of the first semiconductor material layer and the electroluminescent layer; and the gate layer, the first insulating layer, the first electrode layer, the bottom semiconductor material layer and the second electrode layer constitute the VTFT, and the second electrode layer, the second insulating layer, the first semiconductor material layer, the electroluminescent layer, the second semiconductor material layer and the source-drain pattern constitute the OLET.

In some embodiments, the plurality of functional layers comprise a gate layer, a first insulating layer, a first electrode layer, a bottom semiconductor material layer, a second electrode layer, a third electrode layer, a second insulating layer, a first semiconductor material layer, an electroluminescent layer, a second semiconductor material layer and a source-drain pattern that are sequentially arranged in a direction away from the substrate, the source-drain pattern comprises a source and a drain, at least one of the source and the drain covers side surfaces of the first semiconductor material layer and the electroluminescent layer, and the gate layer, the first insulating layer, the first electrode layer, the bottom semiconductor material layer and the second electrode layer constitute the VTFT, and the third electrode layer, the second insulating layer, the first semiconductor material layer, the electroluminescent layer, the second semiconductor material layer and the source-drain pattern constitute the OLET.

In some embodiments, a third insulating layer having a via hole is between the second electrode layer and the third electrode layer, and the third electrode layer is electrically connected to the second electrode layer through the via hole.

In some embodiments, the plurality of functional layers comprises a gate layer, a first insulating layer, a first electrode layer, a bottom semiconductor material layer, a second electrode layer, a second insulating layer, a fourth electrode layer, a first semiconductor material layer, an electroluminescent layer, a second semiconductor material layer and a fifth electrode layer that are sequentially arranged in a direction away from the substrate; and the gate layer, the first insulating layer, the first electrode layer, the bottom semiconductor material layer and the second electrode layer constitute the VTFT, and the second electrode layer, the second insulating layer, the fourth electrode layer, the first semiconductor material layer, the electroluminescent layer, the second semiconductor material layer and the fifth electrode layer constitute the OLET.

In some embodiments, the second insulating layer has a dielectric constant ranging from 5 to 15.

In some embodiments, the second insulating layer is made from aluminium oxide.

In some embodiments, the display substrate further comprises a gate line, a first scanning line, a second scanning line, a first data line and a second data line on the substrate; the gate line is electrically connected to the gate layer, the first scanning line is electrically connected to the first electrode layer, the first data line is electrically connected to the second electrode layer, the second scanning line is electrically connected to the source in the source-drain pattern, and the second data line is electrically connected to the drain in the source-drain pattern.

In some embodiments, the gate layer, the first electrode layer, the second electrode layer and the source-drain pattern are all made from flexible materials.

In some embodiments, materials of the gate layer, the first electrode layer, the second electrode layer and the source-drain pattern comprise graphene.

In some embodiments, the first insulating layer, the bottom semiconductor material layer, the second insulating layer, the first semiconductor material layer, the electroluminescent layer and the second semiconductor material layer are all made from flexible materials.

In some embodiments, the first insulating layer, the bottom semiconductor material layer, the first semiconductor material layer, the electroluminescent layer and the second semiconductor material layer are all made from flexible materials, and the second insulating layer is made from a rigid material and has a thickness of 3 nanometers to 5 nanometers in a direction perpendicular to the substrate.

In some embodiments, the first insulating layer is made from methyl methacrylate; the bottom semiconductor material layer is made from dinaphthothiophene; the first semiconductor material layer is made from N,N'-ditridecylperylene-3,4,9,10-tetracarboxylic diimide; the second semiconductor material layer is made from pentacene; and the electroluminescent layer is made from 8-hydroxyquinoline aluminum salt.

In some embodiments, orthographic projection regions of the pixel units on the substrate are rectangular, and the lengths and the widths of the rectangles are both smaller than or equal to 15 micrometers.

In some embodiments, the orthographic projection region of the OLET on the substrate and the orthographic projection region of the VTFT on the substrate totally overlap.

In some embodiments, both of the source and the drain in the source-drain pattern cover the side surfaces of the electroluminescent layer and the first semiconductor material layer and are in contact with the surface, away from the substrate, of the second insulating layer.

In some embodiments, the plurality of pixel units are in m rows and n columns, m≥2, n≥2, and the display substrate comprises m gate lines, m second scanning lines and m second data lines that are parallel with a row arrangement direction of the plurality of pixel units, and n first scanning lines and x first data lines that are parallel with a column arrangement direction of the plurality of pixel units, and x is equal to an integer to which a half of n is rounded up; when n is an even number, n columns of the pixel units constitute x groups of pixel units that are sequentially arranged, and each group of pixel units comprises two columns of pixel units; when n is an odd number, n columns of the pixel units constitute (x−1) groups of pixel units sequentially arranged and one group of pixel units adjacent to the (x−1) groups of pixel units, each group of the (x−1) groups of the pixel units comprises two columns of pixel units, and the one group of pixel units comprises one column of pixel units; the m gate lines and the m rows of pixel units are in one-to-one correspondence, each gate line is electrically connected to the gate layers in the corresponding row of pixel units, and an orthographic projection region of each gate line on the substrate and an orthographic projection region of each pixel unit corresponding to the gate line on the substrate at least partially overlap; the x first data lines are in one-to-one correspondence with the x groups of pixel units constituted of the n columns of pixel units, each first data line is electrically connected to the second electrode layers in the corresponding group of pixel units, the first data line corresponding to each group of pixel units constituted of two columns of pixel units is between the two columns of pixel units, and the first data line corresponding to the one group of pixel units is at a side, away from the (x−1) groups of pixel units, of the one group of pixel units; the n first scanning lines are in one-to-one correspondence with the n columns of pixel units, each first scanning line is electrically connected to the first electrode layers in the corresponding column of pixel units, and the first scanning line corresponding to each column of pixel units and the first data line electrically connected to each column of pixel units are at two sides in the row arrangement direction of each column of pixel units; the m second scanning lines and the m second data lines are in one-to-one correspondence with the m rows of pixel units, each second scanning line is electrically connected to the sources in the corresponding row of pixel units, each second data line is electrically connected to the drains in the corresponding row of pixel units, and the second scanning line and the second data line that correspond to each row of pixel units are at two sides in the column arrangement direction of each row of pixel units.

In another aspect, at least one embodiment of the present disclosure provides a display panel comprising a display substrate, wherein the display substrate comprises a substrate and a plurality of pixel units on the substrate; each pixel unit comprises a plurality of functional layers that are sequentially arranged in a direction away from the substrate, at least one of the plurality of functional layers, which is close to the substrate, constitutes a vertical thin film transistor (VTFT), at least one of the plurality of functional layers, which is away from the substrate, constitutes an organic light-emitting transistor (OLET), and an orthographic projection region of the OLET on the substrate and an orthographic projection region of the VTFT on the substrate at least partially overlap.

In yet another aspect, at least one embodiment of the present disclosure provides display device, comprising the above display panel.

In still yet another aspect, at least one embodiment of the present disclosure provides a preparation method of a display substrate, comprising: providing a substrate; and sequentially forming a plurality of specified film layers on the substrate, wherein the plurality of specified film layers constitute a plurality of pixel units, the pixel unit comprises a plurality of functional layers arranged in a direction away from the substrate, and each specified film layer comprises the same functional layers in the plurality of pixel units; and at least one of the plurality of functional layers, which is close to the substrate, constitutes a vertical thin film transistor (VTFT), at least one of the plurality of functional layers, which is away from the substrate, constitutes an organic light-emitting transistor (OLET), and an orthographic projection region of the OLET on the substrate and an orthographic projection region of the VTFT on the substrate at least partially overlap.

It should be understood that both the foregoing general description and the following detailed description are merely exemplary and explanatory and are not restrictive of the present application.

BRIEF DESCRIPTION OF THE DRAWINGS

To describe the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

The accompanying drawings, which are incorporated in and constitute part of this description, illustrate embodiments consistent with the present disclosure, and together with the description, serve to explain the principles of the present disclosure.

DETAILED DESCRIPTION

To make the principles of the present disclosure clearer, the present disclosure will be further described in detail below with reference to the accompanying drawings. It is obvious that the described embodiments are only part but not all of the embodiments of the present disclosure. All other embodiments obtained by those of ordinary skill in the art based on the embodiments of the present disclosure without any creative work shall fall within the scope of protection of the present disclosure.

In an OLED display substrate, each pixel unit on a substrate includes a switching TFT, a driving TFT and an OLED that are sequentially arranged in a direction away from the substrate. Since the switching TFT, the driving TFT and the OLED in the OLED display substrate are usually staggered (that is, orthographic projections of the switching TFT, the driving TFT and the OLED on the substrate do not overlap), each pixel unit has a bigger area. Thus, there are less pixel units in unit area of the OLED display substrate, resulting in a lower display accuracy (the display accuracy is usually reflected by resolution, and the lower the display accuracy is, the lower the resolution is) and a poorer display effect of the OLED display substrate.

Figure 1:
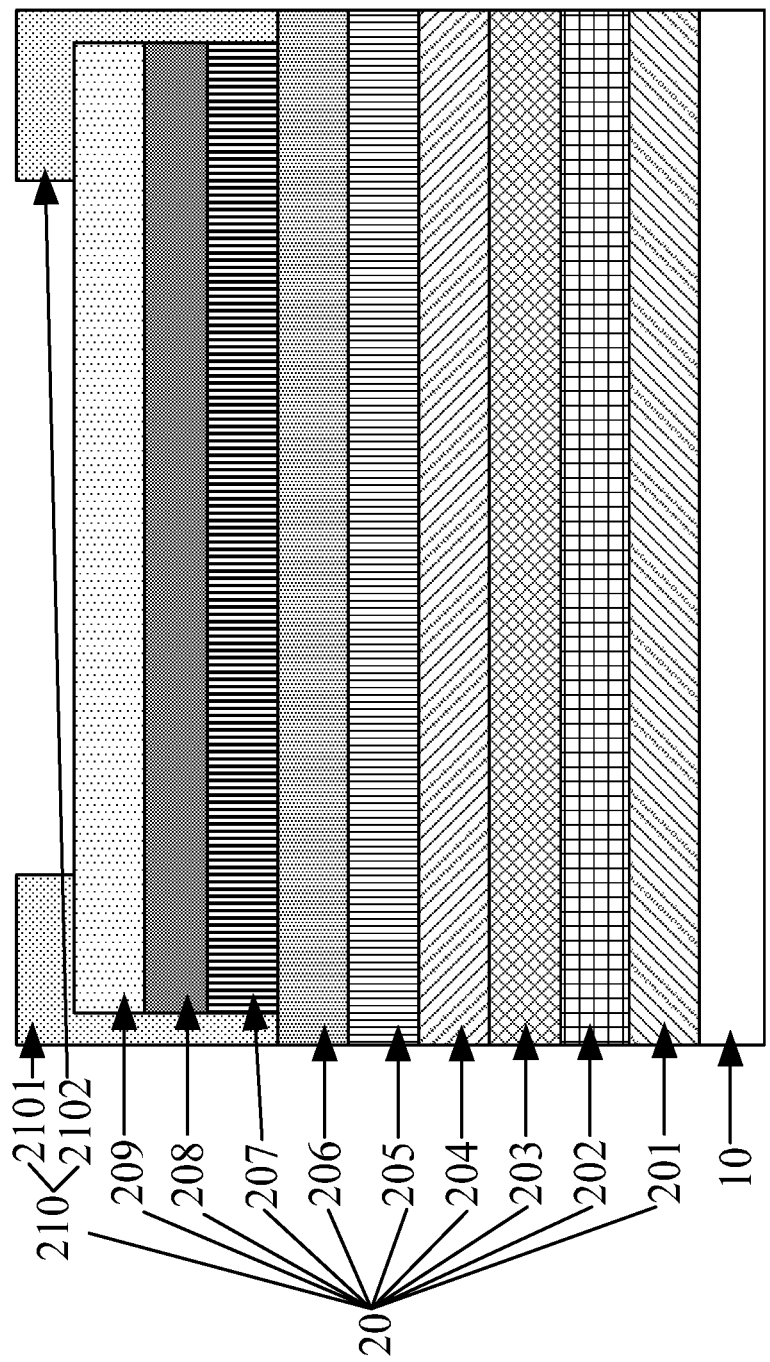
FIG. 1 is a schematic diagram of a structure of a display substrate according to an embodiment of the present disclosure.

FIG. 1 is a schematic diagram of a structure of a display substrate according to an embodiment of the present disclosure. As shown in FIG. 1, the display substrate may include a substrate 10 and a plurality of pixel units 20 (only one pixel unit 20 is shown in FIG. 1) on the substrate. Each pixel unit 20 includes a plurality functional layers sequentially arranged in a direction away from the substrate 10. The plurality of functional layers includes film layers in addition to the substrate 10 in FIG. 1. At least one of the plurality of functional layers, which is close to the substrate 10, constitutes a VTFT (Vertical Thin Film Transistor). At least one of the plurality of functional layers, which is away from the substrate 10, constitutes an OLET (Organic Light-Emitting Transistor). An orthographic projection region (not marked in FIG. 1) of the OLET on the substrate 10 and an orthographic projection region (not marked in FIG. 1) of the VTFT on the substrate 10 at least partially overlap.

In summary, in the display substrate provided in the embodiments of the present disclosure, since the plurality of functional layers stacked in the display substrate form the VTFT and OLET, and the orthographic projection regions of the VTFT and the OLED on the substrate at least partially overlap, the total orthographic projection area of the VTFT and the OLET on the substrate is smaller. As the pixel units have smaller areas, the number of pixel units per unit area in the display substrate is more. Thus, the display substrate has a high resolution and a better display effect.

It should be noted that the VTFT is a thin film transistor of which a source and a drain are arranged in a direction perpendicular to a semiconductor layer, and usually includes a gate, an insulating layer, the source, the semiconductor layer and the drain that are sequentially stacked. In the VTFT, a voltage on the gate is regulated, so as to regulate a conduction state of the semiconductor layer, and further regulate a connection state between the source and the drain. Besides, when the semiconductor layer is turned on, carriers may move toward the source or the drain in the semiconductor layer between the source and the drain.

The OLET is a light-emitting transistor, which is provided with two semiconductor material layers and an electroluminescent layer located between the two semiconductor material layers. The OLET generally includes a gate, an insulating layer, a first semiconductor material layer, the electroluminescent layer, a second semiconductor material layer and a source-drain pattern that are sequentially stacked.

Herein, the source-drain pattern includes a source and a drain that are in one-to-one correspondence with the first semiconductor material layer and the second semiconductor material layer. When the OLET needs to be controlled to emit light, electrons and holes may be injected from the source and the drain respectively, so that the electrons and the holes flow to the electroluminescent layer through the semiconductor material layers in the OLET. The combination of electrons and holes in the electroluminescent layer causes the electroluminescent layer to emit light. The numbers and the flow velocities of the electrons and the holes in the semiconductor material layers of the OLET may be adjusted by regulating a voltage applied to the gate, thereby further adjusting the numbers of the electrons and the holes flowing to the electroluminescent layer. Thus, the brightness of light emitted by the electroluminescent layer may be adjusted.

Continuously referring to FIG. 1, the orthographic projection region of the OLET on the substrate 10 and the orthographic projection region of the VTFT on the substrate 10 may totally overlap. It should be noted that the embodiments of the present disclosure only take that the orthographic projection region of the OLET on the substrate 10 and the orthographic projection region of the VTFT on the substrate totally overlap as an example. Optionally, the orthographic projection region of the OLET on the substrate 10 and the orthographic projection region of the VTFT on the substrate 10 may only partially overlap, which is not limited by the embodiments of the present disclosure.

The plurality of functional layers in each pixel unit may include a gate layer 201, a first insulating layer 202, a first electrode layer 203, a bottom semiconductor material layer 204, a second electrode layer 205, a second insulating layer 206, a first semiconductor material layer 207, an electroluminescent layer 208, a second semiconductor material layer 209 and a source-drain pattern 210 that are sequentially arranged in a direction away from the substrate 10. The source-drain pattern 210 includes a source 2101 and a drain 2102, at least one of the source 2101 and the drain 2102 covers side surfaces (not marked in FIG. 1) of the electroluminescent layer 208 and the first semiconductor material layer 207. It should be noted that each functional layer has two opposite surfaces, a side surface in each functional layer is configured to connect the two surfaces. The two surfaces are usually parallel to the substrate, and the side surface is usually perpendicular to or inclined relative to the substrate.

The gate layer 201, the first insulating layer 202, the first electrode layer 203, the bottom semiconductor material layer 204 and the second electrode layer 205 constitute the VTFT. The second electrode layer 205, the second insulating layer 206, the first semiconductor material layer 207, the electroluminescent layer 208, the second semiconductor material layer 209 and the source-drain pattern 210 constitute the OLET.

One of the first semiconductor material layer 207 and the second semiconductor material layer 209 is an N-type semiconductor material layer, and the other thereof is a P-type semiconductor material layer. The embodiments of the present disclosure only take that the first semiconductor material layer 207 is the N-type semiconductor material layer and the second semiconductor material layer 209 is the P-type semiconductor material layer as an example. Optionally, it may also be that the first semiconductor material layer 207 is the P-type semiconductor material layer and the second semiconductor material layer 209 is the N-type semiconductor material layer.

In the plurality of the functional layers of FIG. 1, the second electrode layer 205 may serve as both a drain layer of the VTFT and a gate layer of the OLET, such that a driving signal output by the VTFT may directly reach the OLET to drive the OLED to emit light. Thus, the response speed of the pixel unit is improved.

Figure 2:
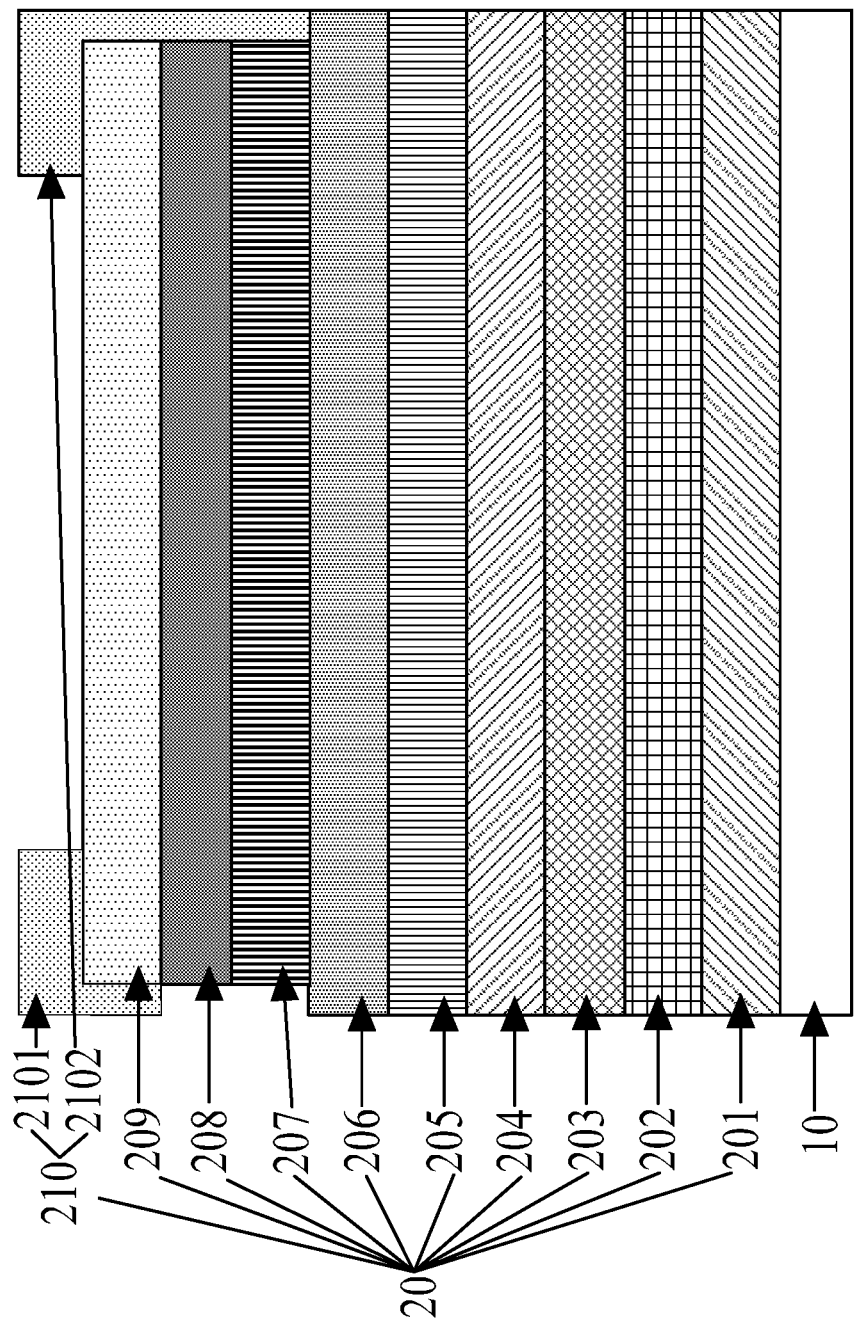
FIG. 2 is a schematic diagram of a structure of another display substrate according to an embodiment of the present disclosure.

It should be noted that FIG. 1 only takes that both of the source 2101 and the drain 2102 in the source-drain pattern 210 cover the side surfaces of the electroluminescent layer 208 and the first semiconductor material layer 207 as an example. Optionally, FIG. 2 is a schematic diagram of a structure of another display substrate according to an embodiment of the present disclosure. As shown in FIG. 2, the drain 2102 instead of the source 2101 in the source-drain pattern 210 covers the side surfaces of the electroluminescent layer 208 and the first semiconductor material layer 207, which is not limited by the embodiments of the present disclosure. Alternatively, the source 2101 instead of the drain 2102 in the source-drain pattern 210 covers the side surfaces of the electroluminescent layer 208 and the first semiconductor material layer 207.

Optionally, as shown in FIG. 1, when both of the source 2101 and the drain 2102 cover the side surfaces of the electroluminescent layer 208 and the first semiconductor material layer 207, both of the source 2101 and the drain 2102 may also cover a side surface of the second semiconductor material layer 209 and are in contact with the surface, away from the substrate 10, of the second insulating layer 206.

Figure 3:
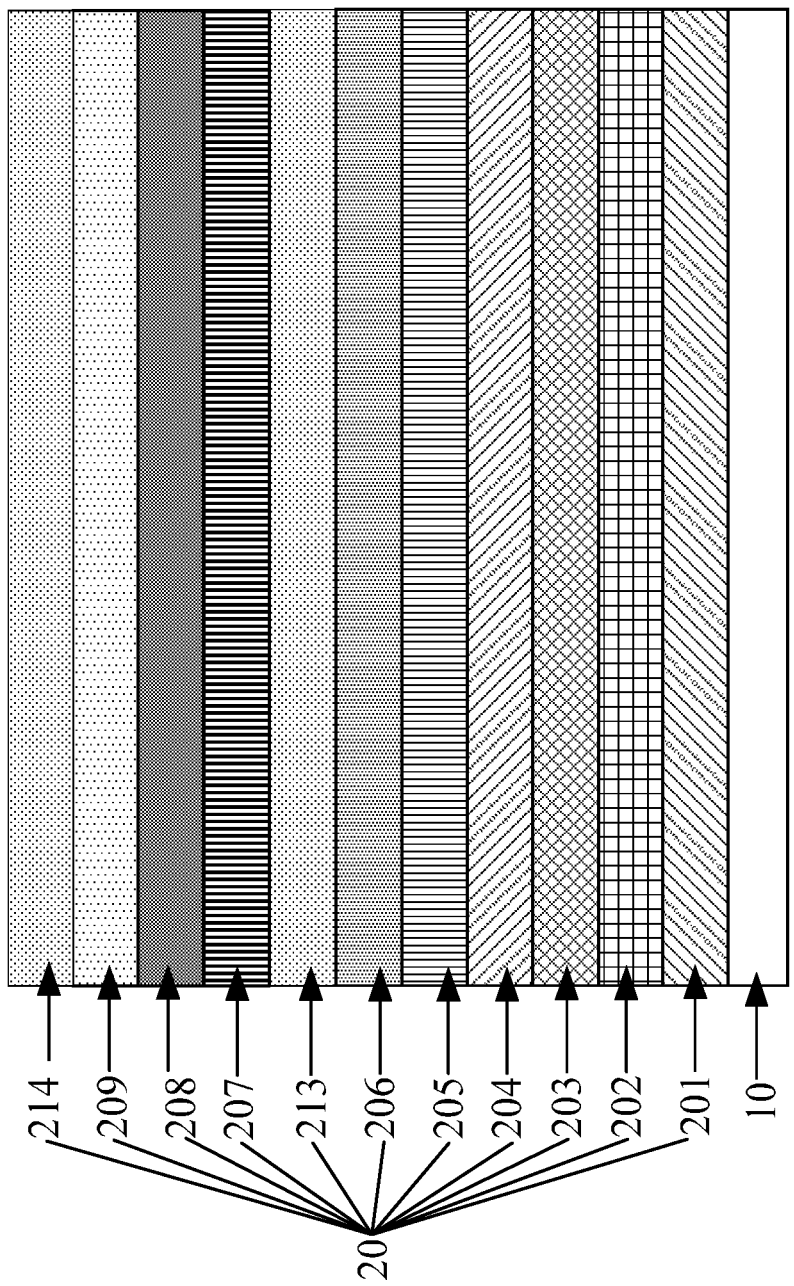
FIG. 3 is a schematic diagram of a structure of yet another display substrate according to an embodiment of the present disclosure.

Moreover, FIG. 1 and FIG. 2 only take that both of the source 2101 and the drain 2102 in the OLET are electrically connected to the second semiconductor material layer 209 as an example. Optionally, FIG. 3 is a schematic diagram of a structure of yet another display substrate according to an embodiment of the present disclosure. As shown in FIG. 3, the plurality of functional layers include a gate layer 201, a first insulating layer 202, a first electrode layer 203, a bottom semiconductor material layer 204, a second electrode layer 205, a second insulating layer 206, a fourth electrode layer 213, a first semiconductor material layer 207, an electroluminescent layer 208, a second semiconductor material layer 209 and a fifth electrode layer 214 that are sequentially arranged in a direction away from the substrate 10.

Herein, the gate layer 201, the first insulating layer 202, the first electrode layer 203, the bottom semiconductor material layer 204 and the second electrode layer 205 constitute the VTFT. The second electrode layer 205, the second insulating layer 206, the fourth electrode layer 213, the first semiconductor material layer 207, the electroluminescent layer 208, the second semiconductor material layer 209 and the fifth electrode layer 214 constitute the OLET. One of the fourth electrode layer 213 and the fifth electrode layer 214 is the source of the OLET, and the other thereof is the drain of the OLET. The embodiment shown in FIG. 3 only takes that the fourth electrode layer 213 is the source of the OLET and the fifth electrode layer 214 is the drain of the OLET as an example. It may also be that the fourth electrode layer 213 is the drain of the OLET and the fifth electrode layer 214 is the source of the OLET. In the embodiment shown in FIG. 3, the source (namely, the fourth electrode layer 213) in OLET is electrically connected to the first semiconductor material layer 207 instead of the second semiconductor material layer 209, and the drain (namely, the fifth electrode layer 214) is electrically connected to the second semiconductor material layer 209 instead of the first semiconductor material layer 207.

In the embodiments (for example, the embodiment shown in FIG. 1, FIG. 2 or FIG. 3) of the present disclosure, the second insulating layer 206 is made from a high-dielectric-constant insulating material. Exemplarily, the second insulating layer 206 has a dielectric constant ranging from 5 to 15. For example, the second insulating layer 206 may be made from aluminium oxide. Optionally, the dielectric constant of the second insulating layer 206 may be in other ranges, e.g., 10 to 30, and the material of the second insulating layer 206 may also include other high-dielectric-constant insulating materials, e.g., calcium oxide, which is not limited by the embodiments of the present disclosure.

It should be noted that under the same driving voltage, the luminance of the OLET is positively correlated with the dielectric constant of the material of the second insulating layer 206 in the OLET. That is, under the same driving voltage, when the second insulating layer 206 is made from the high-dielectric-constant insulating material, the luminance of the OLET is high and the pixel unit has an excellent display effect. Under the same luminance, the driving voltage required by the OLET is lower, such that the energy consumption of the pixel unit is further reduced. It should be noted that the dielectric constant of the insulating material may reflect the electrostatic storage capability of the insulating material in an electric field, and the larger the dielectric constant of the insulating material is, the higher the electrostatic storage capability of the insulating material in the electric field is.

In addition, under the same driving voltage, the luminance of the OLET and the current carrier mobility of the semiconductor material layers in the OLET are in positive correlation. That is, under the same luminance, the higher the dielectric constant of the second insulating layer 206 is, the lower the current carrier mobility required by the semiconductor material layers in the OLET is. In this way, the OLET demands less on the current carrier mobility of the semiconductor material layers. Thus, the OLET may be applicable to the semiconductor material layers with various current carrier mobility.

It should be noted that the current carrier mobility of the semiconductor material layers may reflect movement speeds of carriers in the semiconductor material layers under the action of the electric field, and the higher the current carrier mobility of the semiconductor material layers is, and the more quickly the carriers in the semiconductor material layers move under the action of the electric field.

Optionally, all the electrode layers (such as the gate layer 201, the first electrode layer 203, the second electrode layer 205 and the source-drain pattern 210 in FIG. 1 and FIG. 2) in the pixel unit may be made from flexible materials. At this time, when the pixel unit is impacted by an external force, all the electrode layers in the pixel unit may buffer the external force, so that the impact resistance of the pixel unit is improved.

Exemplarily, the gate layer 201, the first electrode layer 203, the second electrode layer 205 and the source-drain pattern 210 in FIG. 1 and FIG. 2 may be made from graphene. Optionally, the gate layer 201, the first electrode layer 203, the second electrode layer 205 and the source-drain pattern 210 may be made from other flexible materials, e.g., carbon nanotubes, which is not limited by the embodiments of the present disclosure.

Optionally, in the embodiments (for example, the embodiment shown in FIG. 1, FIG. 2 or FIG. 3) of the present disclosure, the first insulating layer 202, the bottom semiconductor material layer 204, the second insulating layer 206, the first semiconductor material layer 207, the electroluminescent layer 208 and the second semiconductor material layer 209 may be made from flexible materials. Besides, since all the film layers other than the substrate 10 in the pixel unit are bendable, the impact resistance of the pixel unit is further improved.

Exemplarily, the first insulating layer 202 and the second insulating layer 206 may be made from polymethyl methacrylate. The bottom semiconductor material layer 204 may be made from dinaphthothiophene. The first semiconductor material layer 207 may be made from N,N'-ditridecylperylene-3,4,9,10-tetracarboxylic diimide. The second semiconductor material layer 209 may be made from pentacene. The electroluminescent layer 208 may be made from 8-hydroxyquinoline aluminum salt.

Optionally, the first insulating layer 202 and the second insulating layer 206 may be made from other flexible materials (e.g., methylsiloxane). The bottom semiconductor material layer 204 may be made from other flexible materials (e.g., polythiophene). The first semiconductor material layer 207 may be made from other flexible materials (e.g., polyaniline). The second semiconductor material layer 209 may be made from other flexible materials (e.g., fullerene). The electroluminescent layer 208 may be made from other flexible materials (benzothiophene).

Alternatively, in the embodiments (for example, the embodiment shown in FIG. 1, FIG. 2 or FIG. 3) of the present disclosure, the first insulating layer 202, the bottom semiconductor material layer 204, the first semiconductor material layer 207, the electroluminescent layer 208 and the second semiconductor material layer 209 may be all made from flexible materials. The second insulating layer 206 may be made from a rigid material and has a thickness of 3 nm to 5 nm in a direction perpendicular to the substrate 10. The flexible materials, relative to the rigid material, are usually deformed after being stressed and may not restore their original shapes after loss of an acting force. The rigid material is almost not changed in shape before and after being stressed.

It should be noted that the bendable degree of an object is in negative correlation with the thickness thereof. Even if an object is made from the rigid material, if it is thin, it may also be deformed when subjected to a force, for example, may be bent. When the second insulating layer 206 made from the rigid material has the thickness of 3 nm to 5 nm in the direction perpendicular to the substrate 10, it indicates that the second insulating layer 206 is relatively thinner and may be bent correspondingly. At this time, since all the film layers other than the substrate 10 in the pixel unit are bendable, the impact resistance of the pixel unit is improved.

Exemplarily, the first insulating layer 202 may be made from polymethyl methacrylate. The bottom semiconductor material layer 204 may be made from dinaphthothiophene. The second insulating layer 206 may be made from aluminium oxide. The first semiconductor material layer 207 may be made from N,N'-ditridecylperylene-3,4,9,10-tetracarboxylic diimide. The second semiconductor material layer 209 may be made from pentacene. The electroluminescent layer 208 may be made from 8-hydroxyquinoline aluminum salt. Optionally, the first insulating layer 202 may be made from other flexible materials (e.g., methylsiloxane). The bottom semiconductor material layer 204 may be made from other flexible materials (e.g., polythiophene). The second insulating layer 206 may be made from other flexible materials (e.g., hafnium (IV) oxide). The first semiconductor material layer 207 may be made from other flexible materials (e.g., polyaniline). The second semiconductor material layer 209 may be made from other flexible materials (e.g., fullerene). The electroluminescent layer 208 may be made from other flexible materials (benzothiophene).

Optionally, in the embodiments (for example, the embodiment shown in FIG. 1, FIG. 2 or FIG. 3) of the present disclosure, the substrate 10 may also be made from a flexible material. At this time, the display substrate may be a flexible display substrate with a bending function. Exemplarily, the substrate 10 may be made from polydimethylsiloxane. Optionally, the substrate 10 may be made from other flexible materials, e.g., polycarbonate, which is not limited by the embodiments of the present disclosure.

Figure 4:
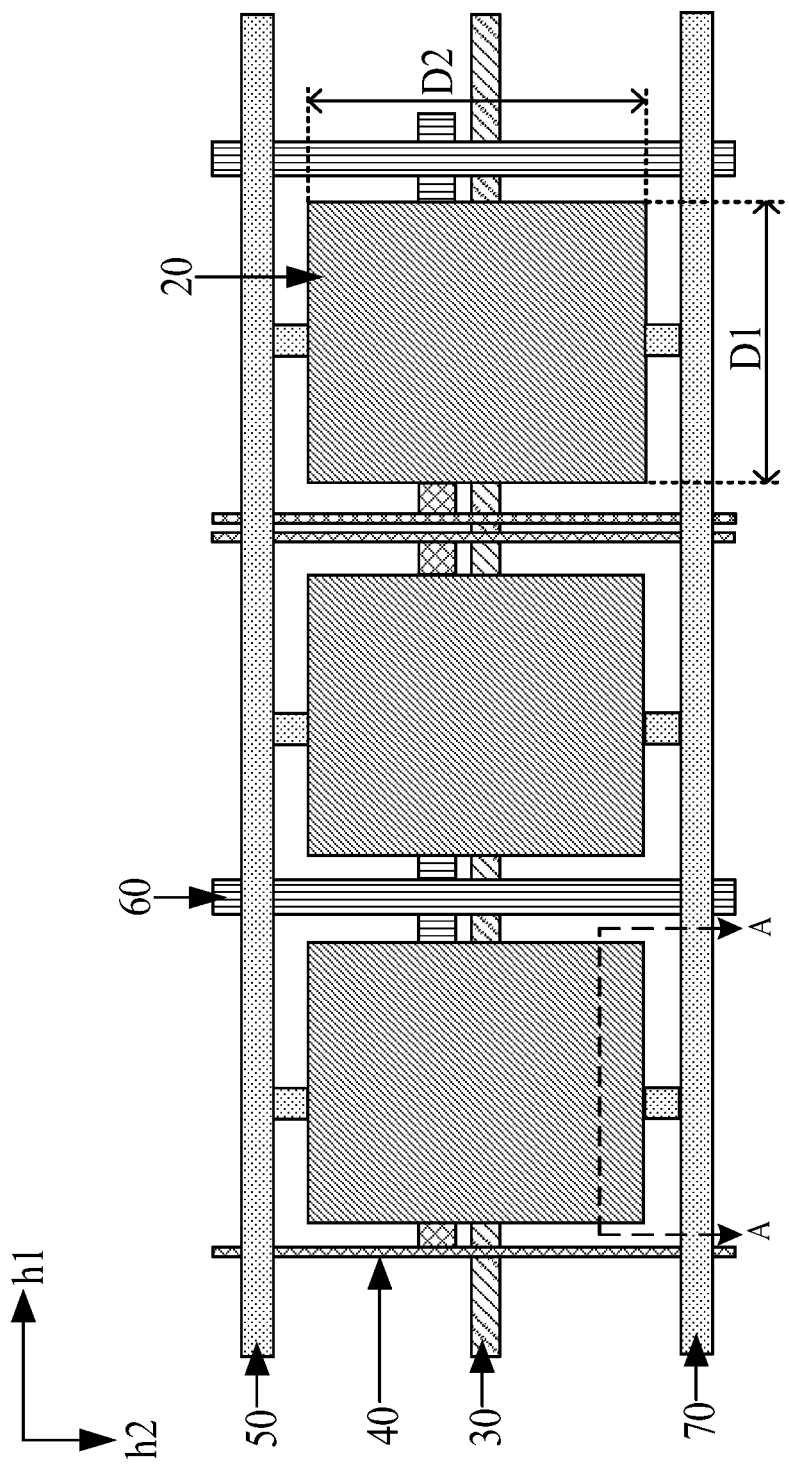
FIG. 4 is a schematic diagram of a structure of still yet another display substrate according to an embodiment of the present disclosure.

FIG. 4 is a schematic diagram of a structure of yet another display substrate according to an embodiment of the present disclosure and also shows a top view of the display substrate. FIG. 1, FIG. 2 and FIG. 3 respectively show schematic views of a section AA in FIG. 4. In addition, FIG. 4 only shows the position of the pixel unit 20 but not a film layer structure in the pixel unit 20.

As shown in FIG. 4 and based on FIG. 1, the display substrate may further include a gate line 30, a first scanning line 40, a second scanning line 50, a first data line 60 and a second data line 70 that are located on the substrate. The gate line 30 may be electrically connected to the gate layer (not shown in FIG. 4). The first scanning line 40 may be electrically connected to the first electrode layer (not shown in FIG. 4). The first data line 60 may be electrically connected to the second electrode layer (not shown in FIG. 4). The second scanning line 50 may be electrically connected to the source in the source-drain pattern (not shown in FIG. 4). The second data line 70 may be electrically connected to the drain in the source-drain pattern.

Optionally, continuously referring to FIG. 4, the plurality of pixel units 20 in the display substrate may be arranged in m rows and n columns, m≥2, and n≥2. FIG. 4 only shows parts of one row of the pixel units 20. As shown in FIG. 4, the display substrate may include m gate lines 30, m second scanning lines 50 and m second data lines 70, which are parallel to a row arrangement direction h1 of the plurality of pixel units 20; as well as n first scanning lines 40 and x first data lines 60, which are parallel to a column arrangement direction h2 of the plurality of pixel units 20, and x is equal to an integer to which a half of n is rounded up. For example, when n is equal to 100, x is equal to 50. When n is equal to 99, x is equal to 50.

In the m rows and n columns of pixel units 20, the n columns of pixel units constitute x groups of pixel units. Exemplarily, when n is an even number, the n columns of pixel units constitute x groups of that are sequentially arranged, and each group of pixel units includes two columns of pixel units. When n is an odd number, the n columns of the pixel units constitute (x−1) groups of pixel units that are sequentially arranged and one group of pixel units adjacent to the (x−1) groups of pixel units, each group of the (x−1) groups of the pixel units includes two columns of pixel units, and the one group of pixel units adjacent to the (x−1) groups of pixel units includes one column of pixel units.

For example, when n is equal to 100 (n is an even number), x is equal to 50, the n columns of pixel units constitute 50 groups of pixel units, and each group of pixel units includes two columns of pixel units 20. For another example, when n is equal to 99 (n is an odd number), x is equal to 50, and the n columns of pixel units constitute 50 groups of pixel units, which include 49 groups of sequentially arranged pixel units and one group of pixel units adjacent to the 49 groups of pixel units. Each group of the 49 groups of pixel units includes two columns of pixel units 20. The one group of pixel units includes one column of pixel units 20.

Continuously referring to FIG. 4, the m gate lines 30 and the m rows of pixel units 20 are in one-to-one correspondence. Each gate line 30 is electrically connected to the gate layers in the row of pixel units 20 which corresponds to the gate line 30. An orthographic projection region of each gate line 30 on the substrate and orthographic projection regions of the row of pixel units 20 which corresponds to the gate line 30 on the substrate 20 at least partially overlap.

The x first data lines 60 are in one-to-one correspondence with the x groups of pixel units 20. Each first data line 60 is electrically connected to the second electrode layers in the corresponding group of pixel units 20. The first data line 60 corresponding to each group of pixel units 20 composed of two columns of pixel units 20 is located between the two columns of pixel units 20. The first data line 60 corresponding to the one group of pixel units 20 composed of one column of pixel units 20 is located at a side, away from the (x−1) groups of pixel units 20, of the one group of pixel units 20.

For example, in the three pixel units 20 in FIG. 4, from left to right, the first pixel unit 20 and the second pixel unit 20 belong to the group of pixel units including two columns of pixel units, and the third pixel unit 20 belongs to the group of pixel units including one column of pixel units. One first data line 60 exists between the first pixel unit 20 and the second pixel unit 20, and one first data line 60 exists at the side, away from the previous two pixel units 20, of the third pixel unit 20.

The n first scanning lines 40 are in one-to-one correspondence with the n columns of pixel units 20. Each first scanning line 40 is electrically connected to the first electrode layers in the column of pixel units 20 which corresponds to the first scanning line 40. The first scanning line 40 corresponding to each column of pixel units 20 and the first data line 60 connected to the column of pixel units 20 are located at two sides in a row arrangement direction h1 of the column of pixel units 20. For example, in the three pixel units 20 in FIG. 4, from left to right, the first scanning line 40 corresponding to the second pixel unit 20 is located at the right side of the second pixel unit 20, and the first data line 60 connected to the second pixel unit 20 is located at the left side of the second pixel unit 20.

The m second scanning lines 50 and the m second data lines 70 are in one-to-one correspondence with the m rows of pixel units 20 (the m second scanning lines 50 are in one-to-one correspondence with the m rows of pixel units 20, and the m second data lines 70 are in one-to-one correspondence with the m columns of pixel units 20).

Each second scanning line 50 is electrically connected to the sources in the corresponding row of pixel units 20. Each second data line 70 is electrically connected to the drains in the corresponding row of pixel units 20. The second scanning line 50 and the second data line 70 that correspond to each row of pixel units 20 are located at two sides in a column arrangement direction h2 of the column of pixel units 20. For example, in the three pixel units 20 in FIG. 4, the second scanning line 50 corresponding to each pixel unit 20 is located above the pixel unit 20, and the second data line 70 corresponding to each pixel unit 20 is located below the pixel unit 20.

Further, with reference to FIG. 1 and FIG. 4, orthographic projection regions of the pixel units 20 on the substrate are rectangular. The lengths D1 and the widths D2 of the rectangles may be smaller than or equal to 15 micrometers. Optionally, the lengths and the widths of the rectangles may also be within other ranges, and for example, may be smaller than or equal to 25 micrometers, which is not limited in the embodiments of the present disclosure.

Figure 5:
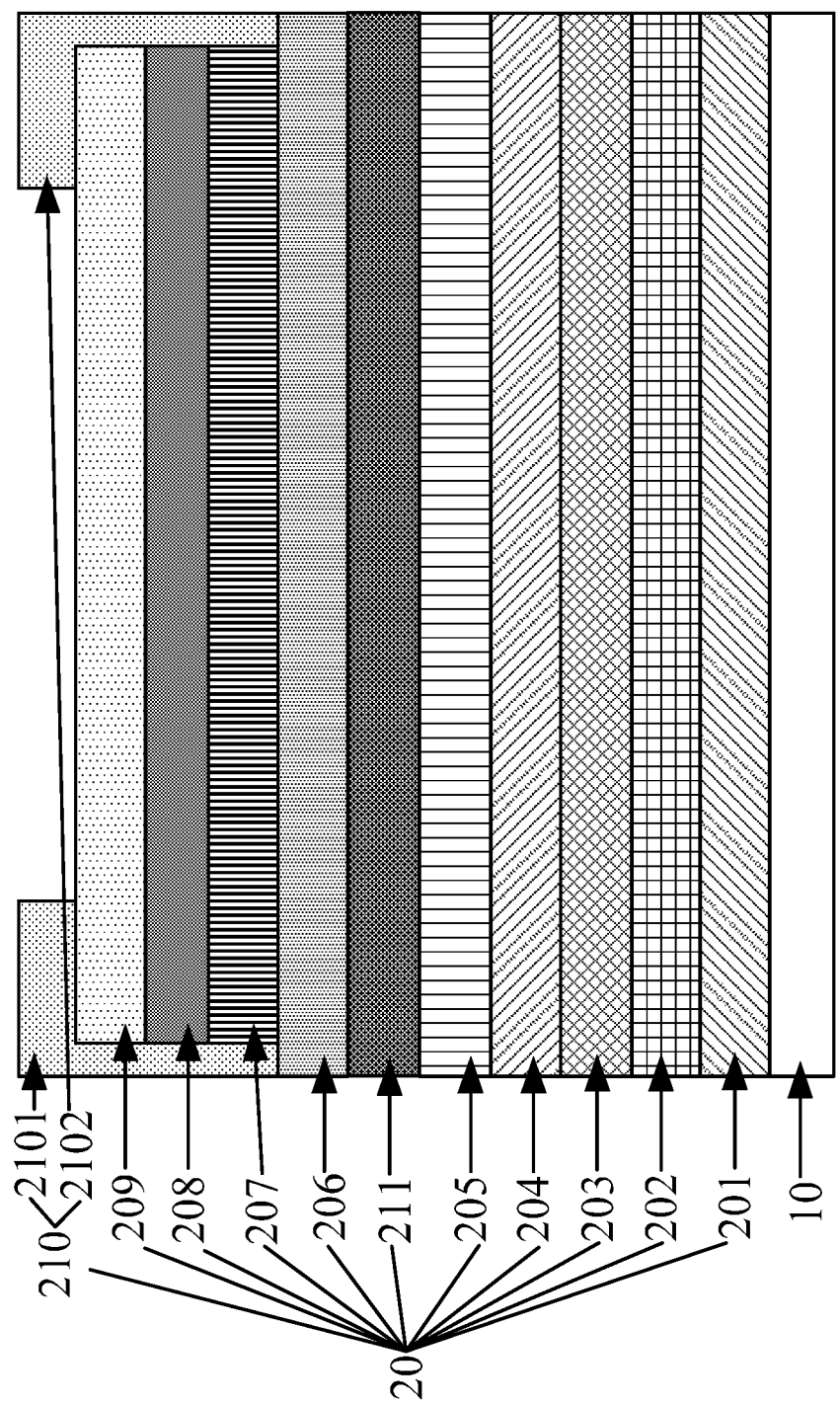
FIG. 5 is a schematic diagram of a structure of still yet another display substrate according to an embodiment of the present disclosure.

It should be noted that the embodiment of the present disclosure only takes that the second electrode layer in the pixel unit serves as both the drain of the VTFT and the gate of the OLET. Optionally, as shown in FIG. 5 and based on FIG. 1, a third electrode layer 211 may be disposed between the second electrode layer 205 and the second insulating layer 206. At this time, the second electrode layer 205 may only serve as the drain of the VTFT, and the third electrode layer 211 may only serve as the gate of the OLET. That is, the gate layer 201, the first insulating layer 202, the first electrode layer 203, the bottom semiconductor material layer 204 and the second electrode layer 205 constitute the VTFT. The third electrode layer 211, the second insulating layer 206, the first semiconductor material layer 207, the electroluminescent layer 208, the second semiconductor material layer 209 and the source-drain pattern 210 constitute the OLET.

Figure 6:
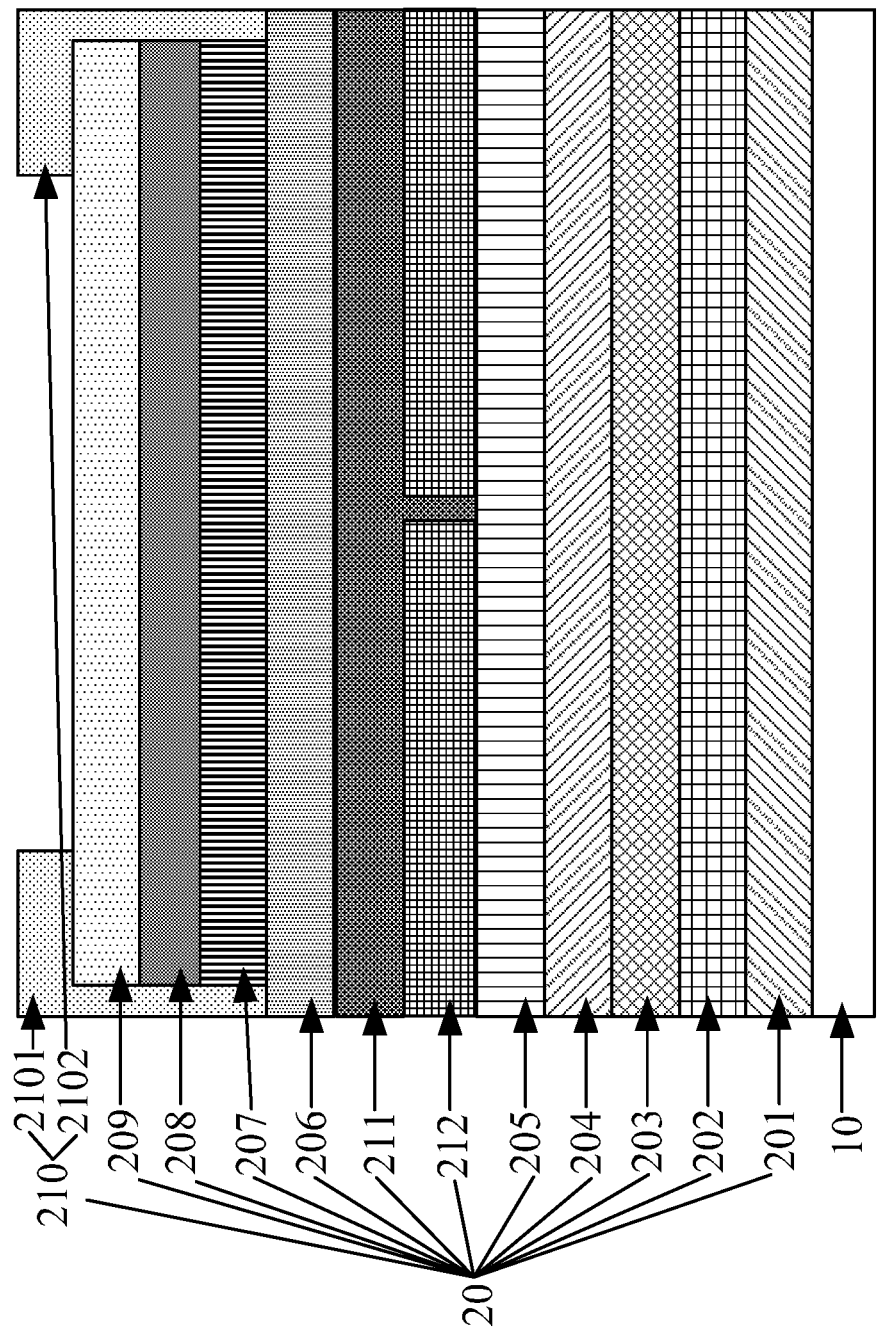
FIG. 6 is a schematic diagram of a structure of still yet another display substrate according to an embodiment of the present disclosure.

In addition, as shown in FIG. 6 and based on FIG. 5, a third insulating layer 212 having a via hole (not marked in FIG. 6) may be disposed between the second electrode layer 205 and the third electrode layer 211, and the third electrode layer 211 is electrically connected to the second electrode layer 205 through the via hole.

With reference to FIG. 1 and FIG. 4, during use of the display substrate provided by the embodiments of the present disclosure, a gate voltage may be applied to the gate layer 201 through the gate line 30. A first forward voltage may be applied to the first electrode layer 203 through the first scanning line 40. A first backward voltage may be applied to the second electrode layer 205 through the first data line 50. A second forward voltage is applied to the source 2101 through the second scanning line 60. A second backward voltage is applied to the drain 2102 through the second data line 70. Thus, the carriers in the first semiconductor material layer 207 and the second semiconductor material layer 209 are injected into the electroluminescent layer 208 to enable the electroluminescent layer 208 to emit light.

Optionally, the magnitude of the current of the second electrode layer 205 may be adjusted by adjusting the magnitude of the gate voltage applied by the gate line 30 to the gate layer 201. When the current of the second electrode layer 205 changes, the second electrode layer 205, as the gate of the OLET, will affect the density of the carriers in the first semiconductor material 207 and the second semiconductor material layer 209. Further, the luminance of the electroluminescent layer 208 may be adjusted.

The higher the gate voltage applied by the gate line 30 to the gate layer 201 is, the greater the current of the second electrode layer 205 is, the higher the carrier density in the first semiconductor material layer 207 and the second semiconductor material layer 209 is, and the higher the luminance of the electroluminescent layer 208 is.

Moreover, when the electrode layers, the insulating layers and the bottom semiconductor material layers in the VTFT and the TFT are made from the same material, source voltages and drain voltages of both VTFT and the TFT are 15 V, and gate voltages of the VTFT and the TFT are 10 V, source current and drain current of the VTFT are about $1*10^{-4}$ amperes, and source current and drain current of the TFT are about $1*10^{-6}$ amperes. When the magnitudes of the source current and the drain current that are required by a drive transistor in the pixel unit are constant, the VTFT requires a lower gate voltage than the TFT. Thus, the energy consumption of the pixel unit is reduced.

In summary, in the display substrate provided by the embodiments of the present disclosure, since the plurality of functional layers stacked in the display substrate form the VTFT and the OLET, and the orthographic projection regions of the VTFT and the OLET on the substrate at least partially overlap. Therefore, the total orthographic projection area of the VTFT and the OLET on the substrate is smaller. As the pixel units have smaller areas, the number of pixel units per unit area in the display substrate is more. Thus, the display substrate has a higher resolution and a better display effect.

Figure 7:
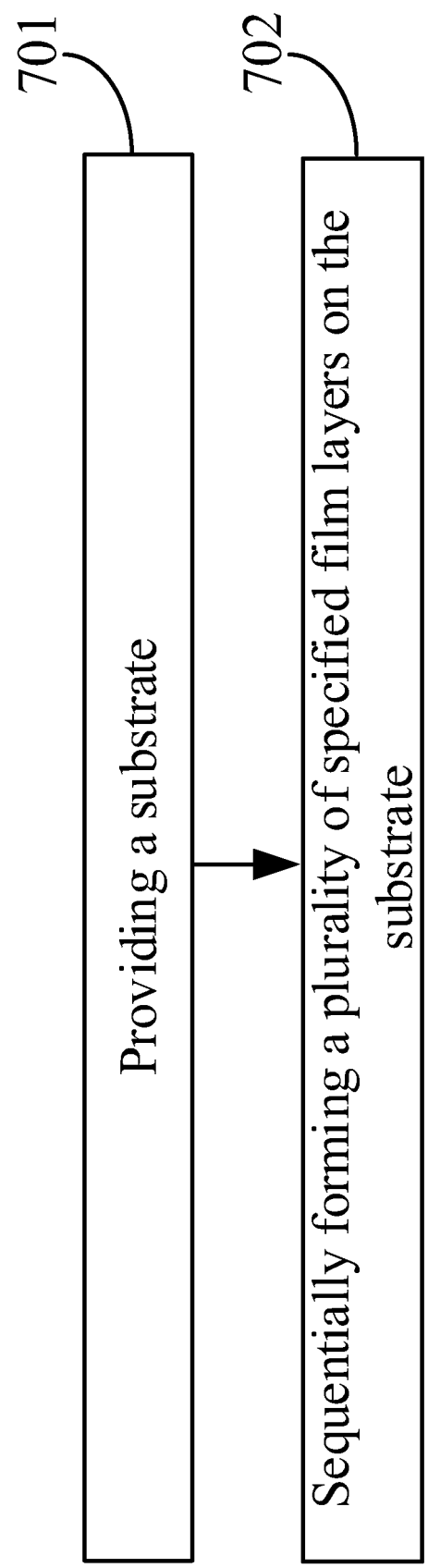
FIG. 7 is a flow chart of a preparation method of a display substrate according to an embodiment of the present disclosure.

FIG. 7 is a flow chart of a preparation method of a display substrate according to an embodiment of the present disclosure. The preparation method of the display substrate may be used for preparing the display substrate shown in any one of FIGS. 1-6. As shown in FIG. 7, the preparation method of the display substrate may include the following steps.

In step 701, a substrate is provided.

In step 702, a plurality of specified film layers are sequentially formed on the substrate.

Herein, the plurality of specified film layers constitute a plurality of pixel units. Each pixel unit includes a plurality of functional layers arranged in a direction away from the substrate. Each specified film layer includes the same functional layers in the plurality of pixel units. That is, the same functional layers in the plurality of pixel units constitute one specified film layer. For example, gate layers in all of the plurality of the pixel units constitute one specified film layer, and first electrode layers in all of the plurality of the pixel units constitute another specified film layer.

At least one of the plurality of functional layers, which is close to the substrate, constitutes a VTFT. At least one of the plurality of functional layers, which is away from the substrate, constitutes an OLET. An orthographic projection region of the OLET on the substrate and an orthographic projection region of the VTFT on the substrate at least partially overlap.

In summary, in the display substrate prepared by using the preparation method of the display substrate according to the embodiments of the present disclosure, since the plurality of functional layers stacked in the display substrate form the VTFT and the OLET, and the orthographic projection regions of the VTFT and the OLET on the substrate at least partially overlap, the total orthographic projection area of the VTFT and the OLET on the substrate is smaller. As the pixel units have smaller areas, the number of pixel units per unit area in the display substrate is more. Hence, the display substrate has a higher resolution and a better display effect.

Figure 8:
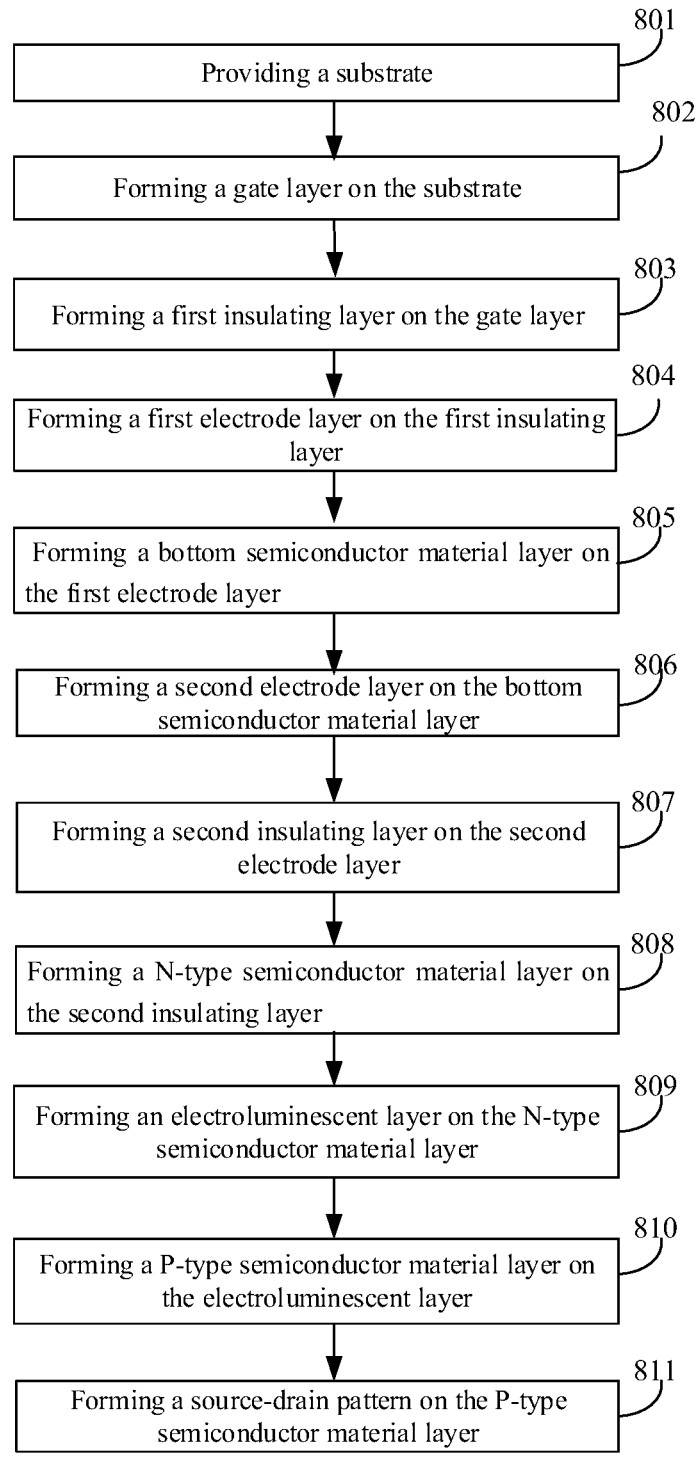
FIG. 8 is a flow chart of another preparation method of a display substrate according to an embodiment of the present disclosure.

FIG. 8 is a flow chart of another preparation method of a display substrate according to an embodiment of the present disclosure. The preparation method of the display substrate may be used for preparing the display substrate shown in FIG. 1. As shown in FIG. 8, the preparation method of the display substrate may include the following steps.

In step 801, a substrate is provided.

Figure 9:
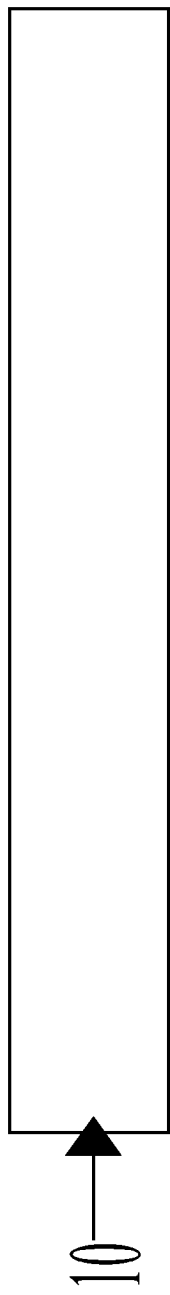
FIG. 9 is a schematic diagram of a structure of a substrate according to an embodiment of the present disclosure.

Exemplarily, a substrate 10 as shown in FIG. 9 may be provided.

In step 802, a gate layer is formed on the substrate.

Figure 10:
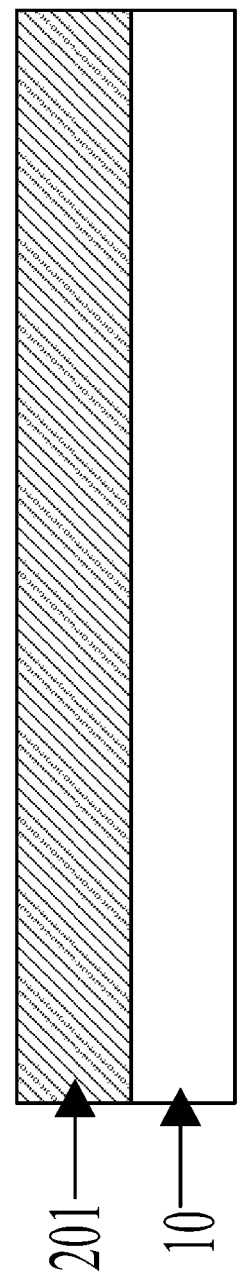
FIG. 10 is a schematic diagram of a structure of a gate layer formed on a substrate according to an embodiment of the present disclosure.

Exemplarily, in the step 802, a chemical vapor deposition method may be adopted to form a gate material layer on the substrate. After that, a one-time composition process may be adopted to process the gate material layer to form a gate pattern (a specified film layer). The gate pattern includes a gate layer 201 in each pixel unit as shown in FIG. 10. Herein, the one-time composition process includes photoresist coating, exposure, developing, etching and photoresist stripping. For example, the one-time composition process may be adopted to process the gate material layer includes: coating the gate material layer with a layer of a photoresist; adopting a mask to expose the photoresist to ensure that the photoresist forms an exposed area and a non-exposed area; adopting a developing process, to remove the photoresist in one of the exposed area and the non-exposed area and to retain the photoresist in the other area; etching the area, which is not covered with the photoresist, of the gate material layer; and after etching is completed, stripping the remaining photoresist to obtain the gate layer 201.

It should be noted that the photoresist may be a positive photoresist or a negative photoresist. If the photoresist is the positive photoresist, after the above-mentioned developing process, the photoresist in the exposed area is removed while the photoresist in the non-exposed area is retained. If the photoresist is the negative photoresist, after the above-mentioned developing process, the photoresist in the non-exposed area is removed while the photoresist in the exposed area is retained.

In step 803, a first insulating layer is formed on the gate layer.

Figure 11:
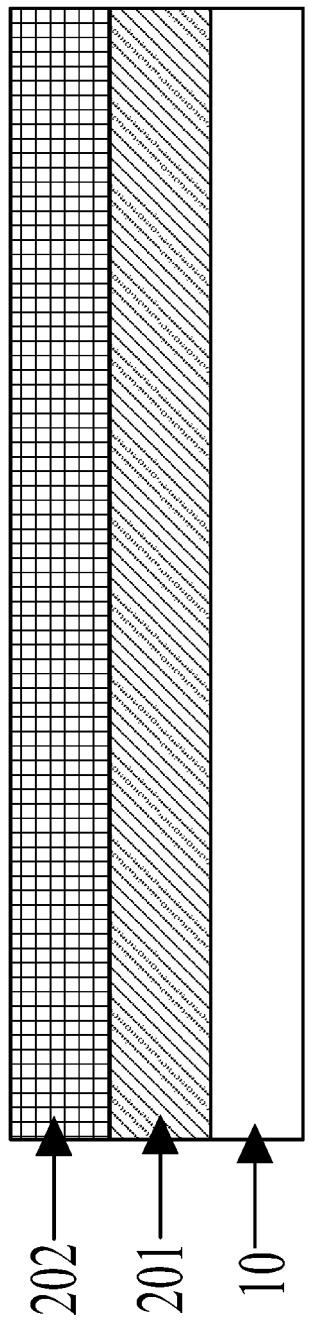
FIG. 11 is a schematic diagram of a structure of a first insulating layer formed on a gate layer according to an embodiment of the present disclosure.

Exemplarily, in the step 803, a spin-coating method may be adopted to form a first preset solution on the gate layer 201. Then, drying and film-forming are performed on the first preset solution to form a first insulating material layer (a specified film layer) which includes a first insulating layer 202 in each pixel unit as shown in FIG. 11.

In step 804, a first electrode layer is formed on the first insulating layer.

Figure 12:
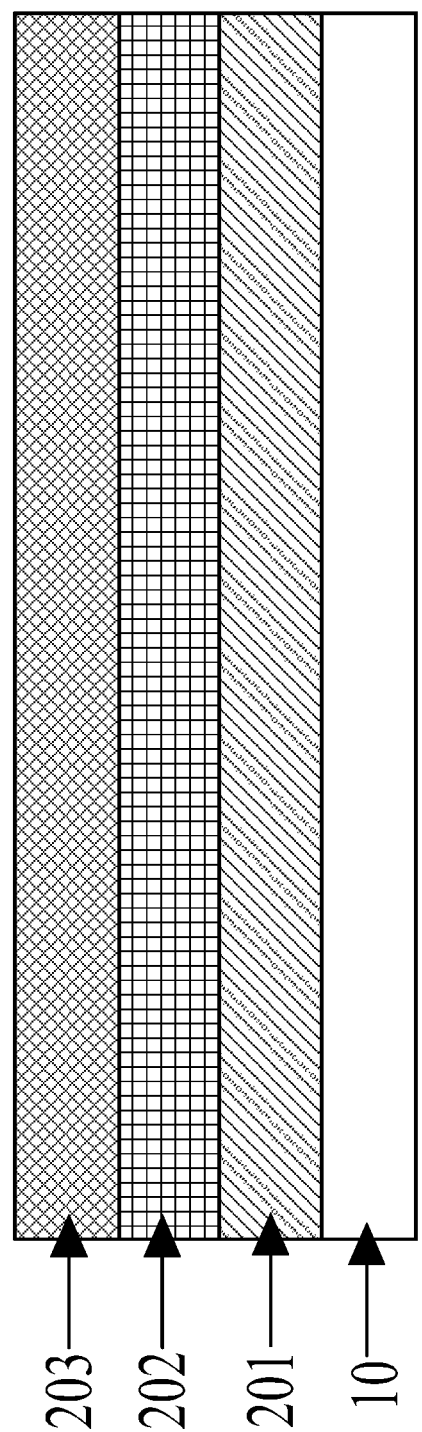
FIG. 12 is a schematic diagram of a structure of a first electrode layer formed on a first insulating layer according to an embodiment of the present disclosure.

Exemplarily, in the step 804, a solution transfer method may be adopted to form a first electrode material layer on the first insulating layer 202. A one-time composition process may be adopted to process the first electrode material layer to form a first electrode pattern (a first specified film layer). The first electrode pattern includes a first electrode layer 203 in each pixel unit as shown in FIG. 12. It should be noted that said adopting the one-time composition process to process the first electrode material layer includes: coating the first electrode material layer with a layer of a photoresist; then adopting a mask to expose the photoresist to ensure that the photoresist forms an exposed area and a non-exposed area; adopting a developing process to remove the photoresist in one of the exposed area and the non-exposed area and to retain the photoresist in the other area; etching the area, which is not covered with the photoresist, of the gate layer, and after etching is completed, stripping the remaining photoresist to obtain the first electrode layer 203. The photoresist may be a positive photoresist or a negative photoresist.

In step 805, a bottom semiconductor material layer is formed on the first electrode layer.

Figure 13:
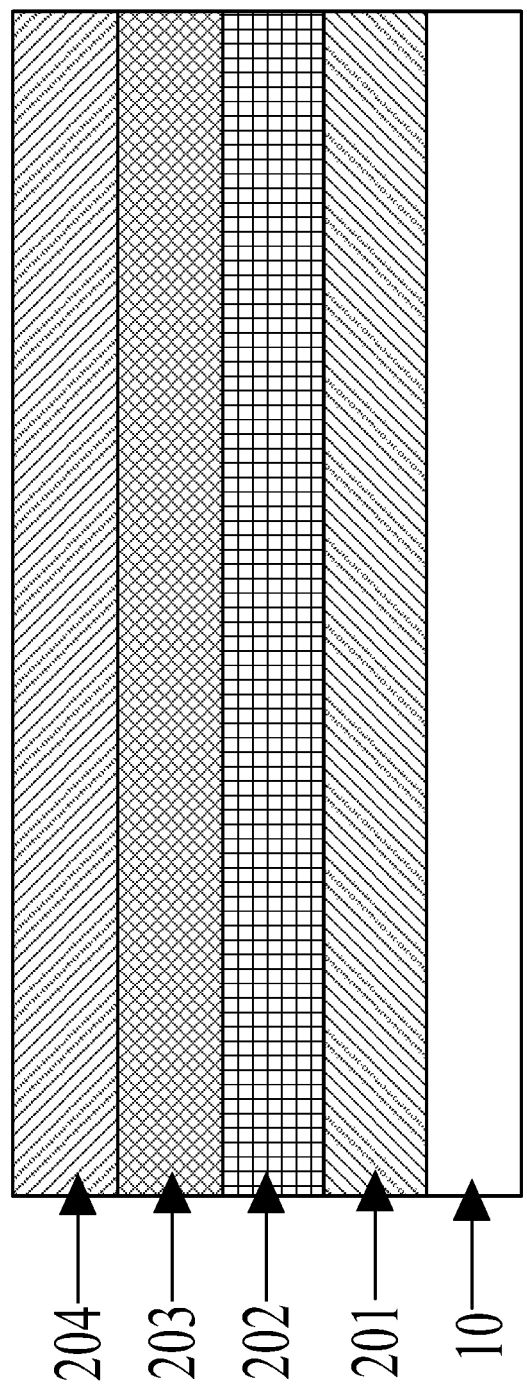
FIG. 13 is a schematic diagram of a structure of a bottom semiconductor material layer formed on a first electrode layer according to an embodiment of the present disclosure.

Exemplarily, in the step 805, an ink-jet printing method may be adopted to form a third preset solution on the first electrode layer 203. After that, drying and film-forming process may be performed on the third preset solution to form a bottom semiconductor pattern (a specified film layer). The bottom semiconductor pattern includes the bottom semiconductor material layer 204 in each pixel unit as shown in FIG. 13.

In step 806, a second electrode layer is formed on the bottom semiconductor material layer.

Figure 14:
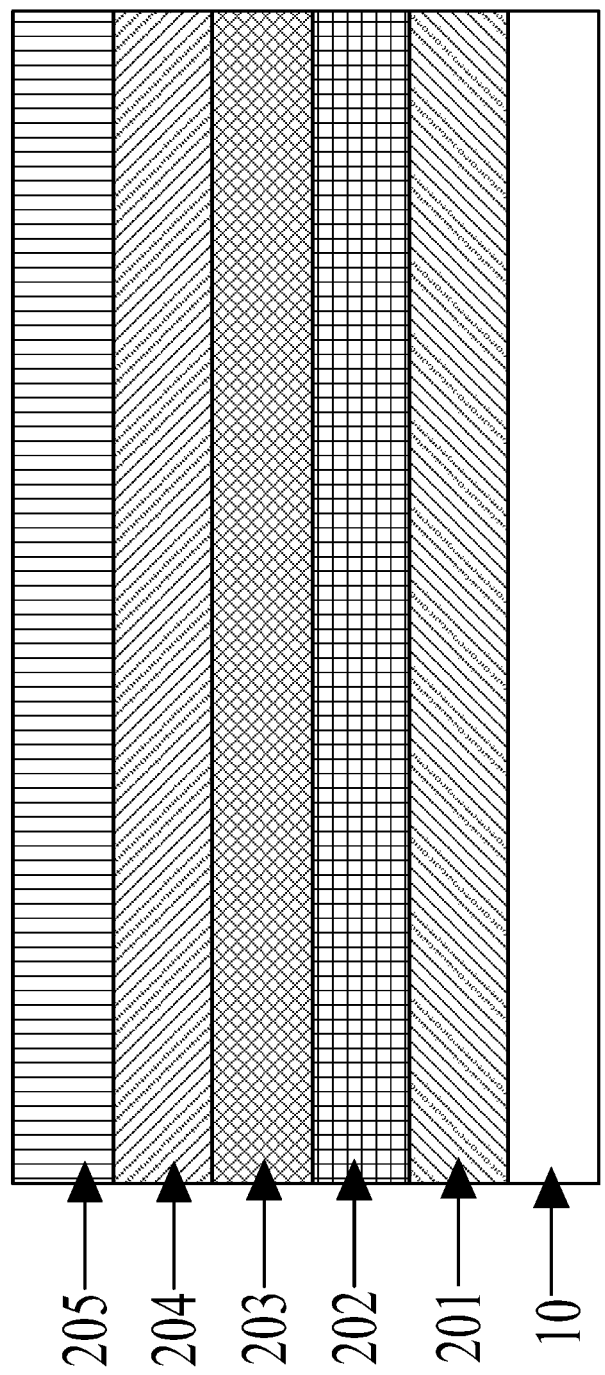
FIG. 14 is a schematic diagram of a structure of a second electrode material layer formed on a bottom semiconductor material layer according to an embodiment of the present disclosure.

Exemplarily, in the step 806, a solution transfer method may be adopted to form a second electrode material layer on the bottom semiconductor material layer 204. The second electrode material layer is etched to form a second electrode pattern (a specified film layer). The second electrode pattern includes a second electrode layer 205 in each pixel unit as shown in FIG. 14. It should be noted that said adopting a one-time composition process to process the second electrode material layer includes: coating the second electrode material layer with a layer of a photoresist; then adopting a mask to expose the photoresist to ensure that the photoresist forms an exposed area and a non-exposed area; adopting a developing process to remove the photoresist in one of the exposed area and the non-exposed area and to retain the photoresist in the other area; etching the area, which is not covered with the photoresist, of the second electrode material layer; and after the etching is completed, stripping the remaining photoresist to obtain the second electrode layer 205. The photoresist may be a positive photoresist or a negative photoresist.

In step 807, a second insulating layer is formed on the second electrode layer.

Figure 15:
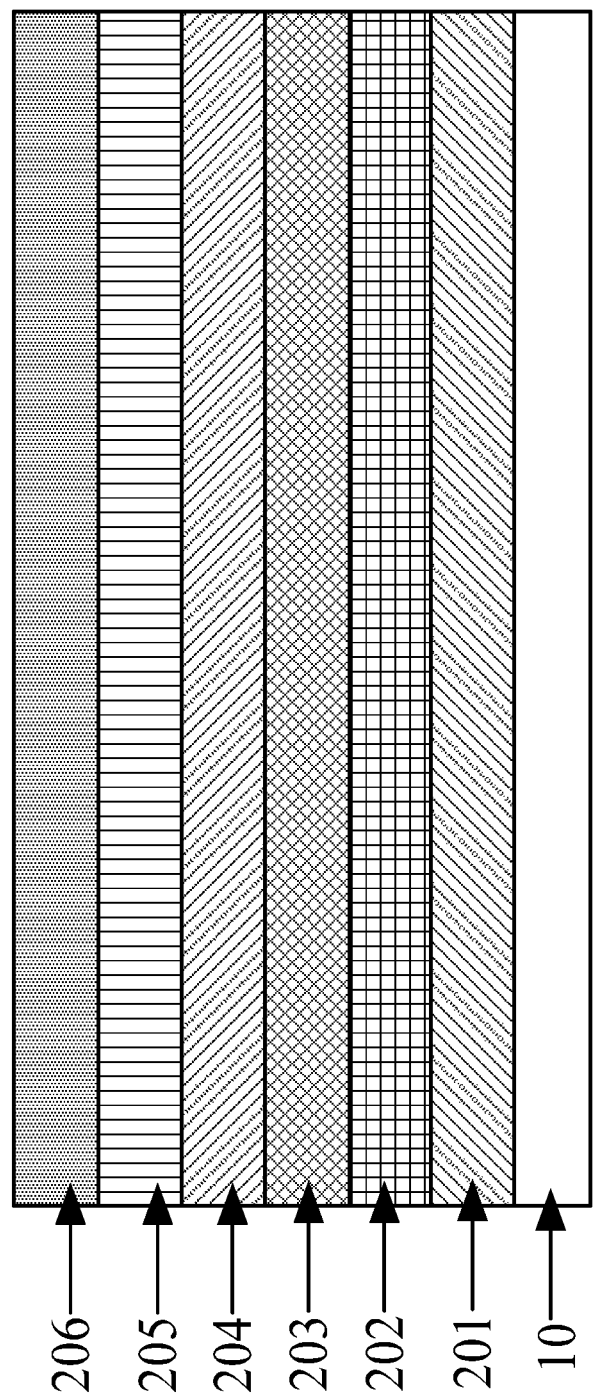
FIG. 15 is a schematic diagram of a structure of a second insulating layer formed on a second electrode material layer according to an embodiment of the present disclosure.

Exemplarily, in the step 807, an atomic layer deposition method may be adopted to form a second insulating material layer on the second electrode layer 205. After that, the second insulating material layer may be etched to form the second insulating material layer (a specified film layer). The second insulating material layer includes a second insulating layer 206 in each pixel unit as shown in FIG. 15. It should be noted that adopting a one-time composition process to process the second insulating material layer includes: coating the second insulating material layer with a layer of a photoresist; adopting a mask to expose the photoresist to ensure that the photoresist forms an exposed area and a non-exposed area; adopting a developing process to remove the photoresist in one of the exposed area and the non-exposed area and to retain the photoresist in the other area; etching the area, which is not covered with the photoresist, of the second electrode material layer, and after the etching is finished, stripping the remaining photoresist to obtain the second insulating layer 206. The photoresist may be a positive photoresist or a negative photoresist.

In step 808, a first semiconductor material layer is formed on the second insulating layer.

Figure 16:
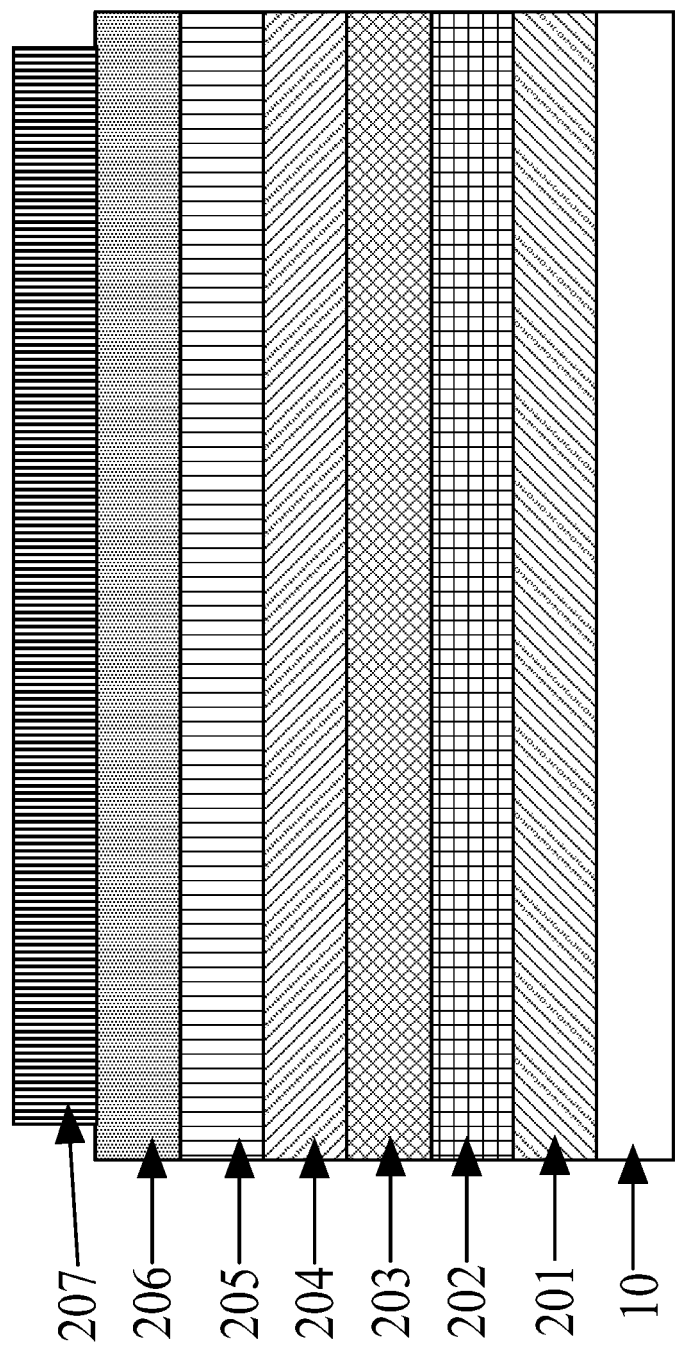
FIG. 16 is a schematic diagram of a structure of a first semiconductor material layer formed on a second insulating layer according to an embodiment of the present disclosure.

Exemplarily, in the step 808, an evaporation process may be adopted to form a first semiconductor material layer (a specified film layer) on the second insulating layer 206. The first semiconductor material layer includes a first semiconductor material layer 207 in each pixel unit as shown in FIG. 16.

In step 809, an electroluminescent layer is formed on the first semiconductor material layer.

Figure 17:
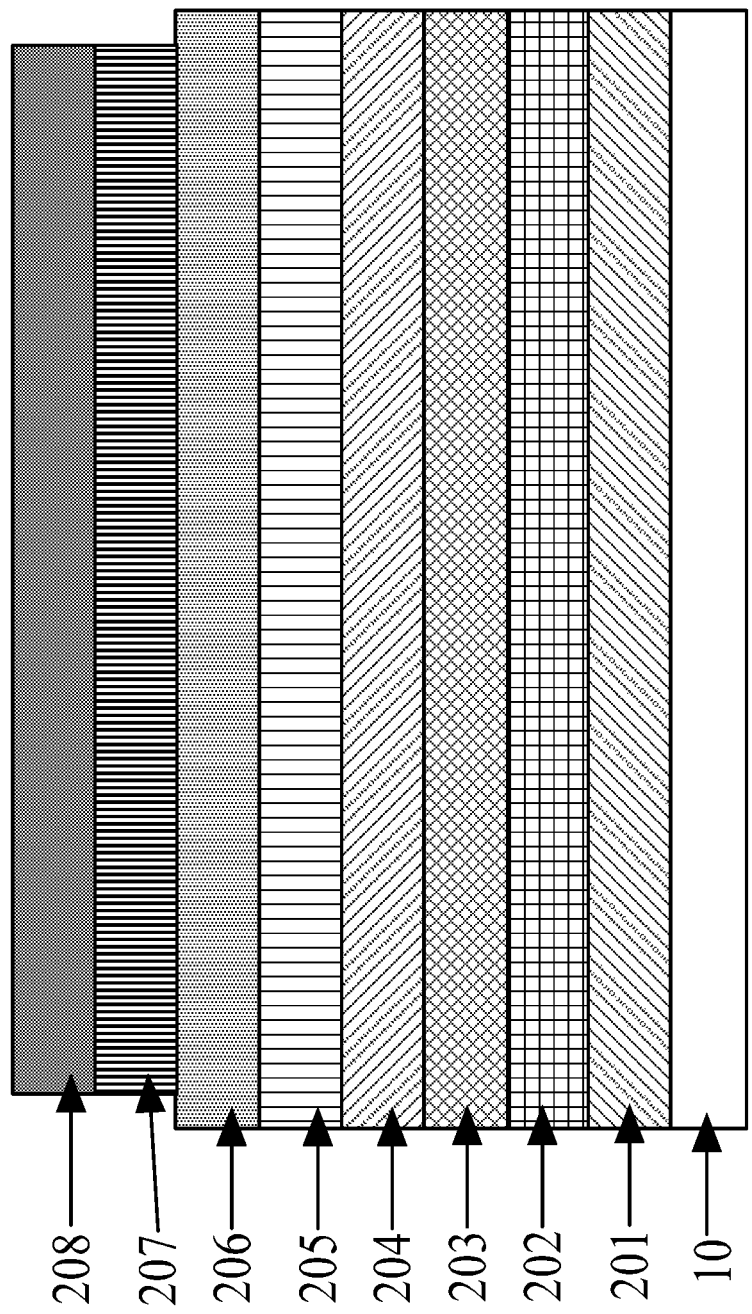
FIG. 17 is a schematic diagram of a structure of an electroluminescent layer formed on a first semiconductor material layer according to an embodiment of the present disclosure.

Exemplarily, in the step 809, an evaporation process may be adopted to form a luminescent layer pattern (a specified film layer) on the first semiconductor material layer 207. The luminescent layer pattern includes an electroluminescent layer 208 in each pixel unit as shown in FIG. 17.

In step 810, a second semiconductor material layer is formed on the electroluminescent layer.

Figure 18:
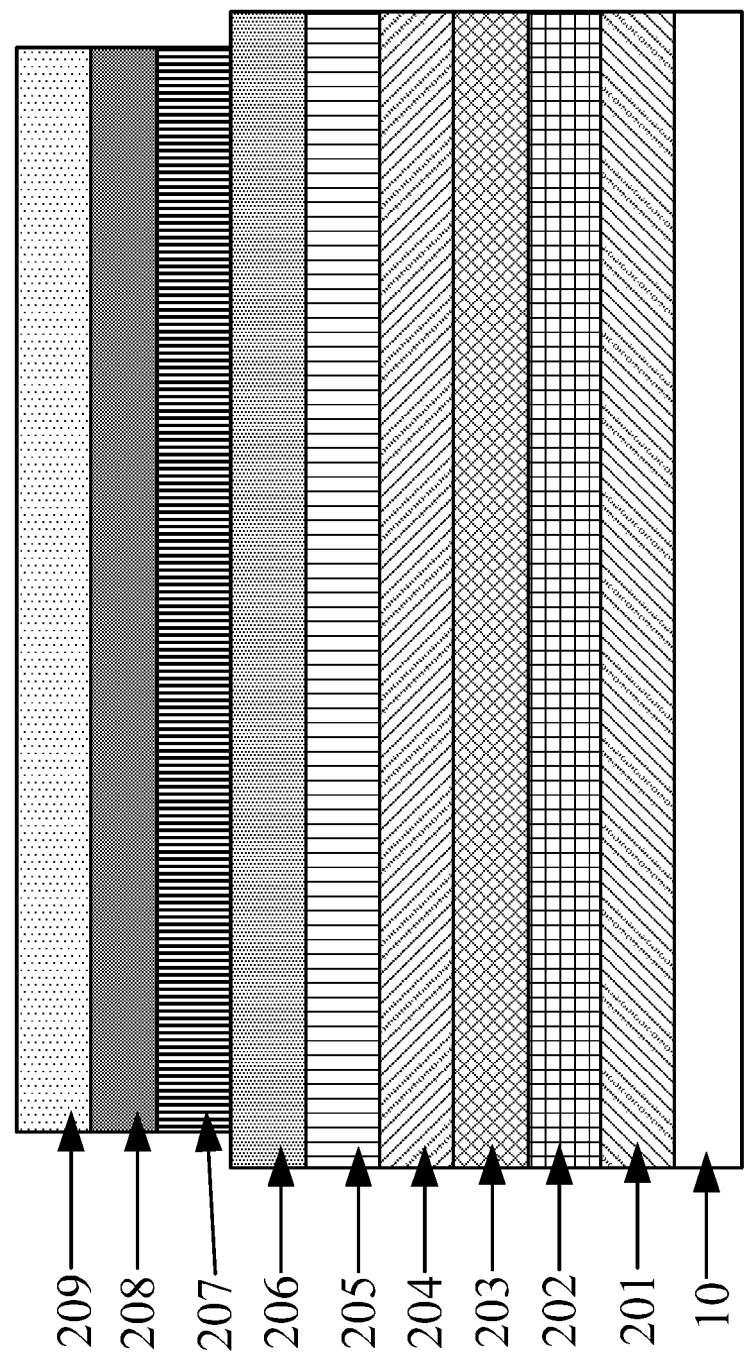
FIG. 18 is a schematic diagram of a structure of a second semiconductor material layer formed on an electroluminescent layer according to an embodiment of the present disclosure.

Exemplarily, in the step 810, an evaporation process may be adopted to form a second semiconductor material layer (a specified film layer) on the electroluminescent layer 208. The second semiconductor material layer includes a second semiconductor material layer 209 in each pixel unit as shown in FIG. 18.

In step 811, a source-drain pattern is formed on the second semiconductor material layer.

Exemplarily, in the step 811, a solution transfer method may be adopted to form a source and drain material layer on the second semiconductor material layer 209. The source and drain material layer is etched to form a third electrode pattern (a specified film layer). The third electrode pattern includes a source-drain pattern 210 in each pixel unit as shown in FIG. 1. The source-drain pattern may include a source 2101 and a drain 2102, at least one of the source 2101 and the drain 2102 covers side surfaces of the electroluminescent layer 208 and the first semiconductor material layer 207.

It should be noted that adopting a one-time composition process to process the source and drain material layer includes: coating the source and drain material layer with a layer of a photoresist; adopting a mask to expose the photoresist to ensure that the photoresist forms an exposed area and a non-exposed area; adopting a developing process to remove the photoresist in one of the exposed area and the non-exposed area and to retain the photoresist in the other area; etching the area, which is not covered with the photoresist, of the source and drain material layer; and after the etching is completed, stripping the rest photoresist to obtain the source-drain pattern 210. The photoresist may be a positive photoresist or a negative photoresist.

It should be noted that in step 802, the gate line connected to the gate layer may be formed while the gate layer is formed. In step 804, the first scanning line connected to the first electrode layer may be formed while the first electrode layer is formed. In step 806, the first data line connected to the second electrode layer may be formed while the second electrode layer is formed. In step 811, the second scanning line connected to the source in the source-drain pattern and a second data line connected to the drain in the source-drain pattern may be formed while the source-drain pattern is formed.

Alternatively, the gate line and the gate layer, as well as the first scanning line and the first electrode layer, the first data line and the second electrode layer, and the second scanning line, the second data line and the source-drain pattern, may be formed step by step. The gate line and the gate layer may be connected after being formed step by step. The first scanning line and the first electrode layer may be connected after being formed step by step. The first data line and the second electrode layer may be connected after being formed step by step. The second scanning line and the source in the source-drain pattern may be connected, and the second data line and the drain in the source-drain pattern may be connected after the second scanning line, the second data line and the source-drain pattern are formed step by step.

In summary, in the display substrate prepared by using the preparation method of the display substrate according to the embodiments of the present disclosure, since the plurality of functional layers stacked in the display substrate forms the VTFT and the OLET, and the orthographic projection regions of the VTFT and the OLET on the substrate at least partially overlap, the total orthographic projection area of the VTFT and the OLET on the substrate is smaller. As the pixel units have smaller areas, the number of pixel units per unit area in the display substrate is more. Thus, the display substrate has a higher resolution and a better display effect.

An embodiment of the present disclosure further provides a display panel which may include the display substrate shown in any one of FIGS. 1-6.

An embodiment of present disclosure further discloses a display device. The display device includes the above-mentioned display panel. Exemplarily, the display device may be such products or components with a display function as electronic paper, a mobile phone, a tablet PC, a television, a display, a laptop, a digital photo frame, a navigator and wearable display equipment.

It should be noted that the embodiments of the display substrate, the embodiments of the preparation method of the display substrate, the embodiments of the display panel, and the embodiments of the display device can be referred to each other, which is not limited by the embodiments of the present disclosure. The step sequence in the method embodiments can be appropriately adjusted, and the steps can also be correspondingly reduced or increased as required. Any variation method that can be easily conceived by those skilled in the art within the technical scope of the present disclosure is intended to be included within the protection scope of the present disclosure, and therefore will not be repeated.

What is claimed is:

1. A display substrate, comprising a substrate and a plurality of pixel units on the substrate;

wherein the pixel unit comprises a plurality of functional layers that are sequentially arranged in a direction away from the substrate, at least one of the plurality of functional layers, which is close to the substrate, constitutes a vertical thin film transistor (VTFT), at least one of the plurality of functional layers, which is away from the substrate, constitutes an organic light-emitting transistor (OLET), and an orthographic projection region of the OLET on the substrate and an orthographic projection region of the VTFT on the substrate at least partially overlap; and the plurality of functional layers comprise a gate layer, a first insulating layer, a first electrode layer, a bottom semiconductor material layer, a second electrode layer, a second insulating layer, a first semiconductor material layer, an electroluminescent layer, a second semiconductor material layer, and a source-drain pattern that are sequentially arranged in a direction away from the substrate, the source-drain pattern comprising a source and a drain, and at least one of the source and the drain covers side surfaces of the first semiconductor material layer and the electroluminescent layer; and the gate layer, the first insulating layer, the first electrode layer, the bottom semiconductor material layer and the second electrode layer constitute the VTFT, and the second electrode layer, the second insulating layer, the first semiconductor material layer, the electroluminescent layer, the second semiconductor material layer and the source-drain pattern constitute the OLET; and the display substrate further comprises a oate line, a first scanning line, a second scanning line, a first data line and a second data line on the substrate;

the gate line is electrically connected to the gate layer, the first scanning line is electrically connected to the first electrode layer, the first data line is electrically connected to the second electrode layer, the second scanning line is electrically connected to the source in the source-drain pattern, and the second data line is electrically connected to the drain in the source-drain pattern; and wherein the plurality of pixel units are in m rows and n columns, m≥2, n≥2, and the display substrate comprises m oate lines, m second scanning lines and m second data lines that are parallel with a row arrangement direction of the plurality of pixel units, and n first scanning lines and x first data lines that are parallel with a column arrangement direction of the plurality of pixel units, and x is equal to an integer to which a half of n is rounded up;

when n is an even number, n columns of the pixel units constitute x groups of pixel units that are sequentially arranged, and each group of pixel units comprises two columns of pixel units; when n is an odd number, n columns of the pixel units constitute (x−1) groups of pixel units that are sequentially arranged and one group of pixel units adjacent to the (x−1) groups of pixel units, each group of the (x−1) groups of the pixel units comprises two columns of pixel units, and the one group of pixel units comprises one column of pixel units;

the m gate lines and the m rows of pixel units are in one-to-one correspondence, each gate line is electrically connected to the gate layers in the corresponding row of pixel units, and an orthographic projection region of each gate line on the substrate and an orthographic projection region of each pixel unit corresponding to the gate line on the substrate at least partially overlap;

the x first data lines are in one-to-one correspondence with the x groups of pixel units constituted of the n columns of pixel units, each first data line is electrically connected to the second electrode layers in the corresponding group of pixel units, the first data line corresponding to each group of pixel units constituted of two columns of pixel units is between the two columns of pixel units, and the first data line corresponding to the one group of pixel units is at a side, away from the (x−1) groups of pixel units, of the one group of pixel units;

the n first scanning lines are in one-to-one correspondence with the n columns of pixel units, each first scanning line is electrically connected to the first electrode layers in the corresponding column of pixel units, and the first scanning line corresponding to each column of pixel units and the first data line electrically connected to each column of pixel units are at two sides in the row arrangement direction of each column of pixel units;

the m second scanning lines and the m second data lines are in one-to-one correspondence with the m rows of pixel units, each second scanning line is electrically connected to the sources in the corresponding row of pixel units, each second data line is electrically connected to the drains in the corresponding row of pixel units, and the second scanning line and the second data line that correspond to each row of pixel units are at two sides in the column arrangement direction of each row of pixel units.

2. The display substrate according to claim 1, wherein the plurality of functional layers further comprise a third electrode layer located between the second electrode layer and the second insulating layer, and the OLET comprises the third electrode layer.

3. The display substrate according to claim 2, wherein a third insulating layer having a via hole is between the second electrode layer and the third electrode layer, and the third electrode layer is electrically connected to the second electrode layer through the via hole.

4. The display substrate according to claim 1, wherein the second insulating layer has a dielectric constant ranging from 5 to 15.

5. The display substrate according to claim 4, wherein the second insulating layer is made from aluminium oxide.

6. The display substrate according to claim 1, wherein the gate layer, the first electrode layer, the second electrode layer and the source-drain pattern are all made from flexible materials.

7. The display substrate according to claim 6, wherein materials of the gate layer, the first electrode layer, the second electrode layer and the source-drain pattern comprise graphene.

8. The display substrate according to claim 6, wherein first insulating layer, the bottom semiconductor material layer, the second insulating layer, the first semiconductor material layer, the electroluminescent layer and the second semiconductor material layer are all made from flexible materials.

9. The display substrate according to claim 6, wherein the first insulating layer, the bottom semiconductor material layer, the first semiconductor material layer, the electroluminescent layer and the second semiconductor material layer are all made from flexible materials, and the second insulating layer is made from a rigid material and has a thickness of 3 nanometers to 5 nanometers in a direction perpendicular to the substrate.

10. The display substrate according to claim 6, wherein the first insulating layer is made from methyl methacrylate; the bottom semiconductor material layer is made from dinaphthothiophene; the first semiconductor material layer is made from N,N'-ditridecylperylene-3,4,9,10-tetracarboxylic diimide; the second semiconductor material layer is made from pentacene; and the electroluminescent layer is made from 8-hydroxyquinoline aluminum salt.

11. The display substrate according to claim 1, wherein orthographic projection regions of the pixel units on the substrate are rectangular, and the lengths and the widths of the rectangles are both smaller than or equal to 15 micrometers.

12. The display substrate according to claim 1, wherein an orthographic projection region of the OLET on the substrate and the orthographic projection region of the VTFT on the substrate totally overlap.

13. The display substrate according to claim 1, wherein both of the source and the drain in the source-drain pattern cover the side surfaces of the electroluminescent layer and the first semiconductor material layer and are in contact with the surface, away from the substrate, of the second insulating layer.

14. A display panel, comprising the display substrate according to claim 1.

15. A display device, comprising the display panel of claim 14.

16. A preparation method of a display substrate, comprising:
providing a substrate; and
sequentially forming a plurality of specified film layers on the substrate,
wherein the plurality of specified film layers constitute a plurality of pixel units, the pixel unit comprises a plurality of functional layers arranged in a direction away from the substrate, and each specified film layer comprises the same functional layers in the plurality of pixel units; and
at least one of the plurality of functional layers, which is close to the substrate, constitutes a vertical thin film transistor (VTFT), at least one of the plurality of functional layers, which is away from the substrate, constitutes an organic light-emitting transistor (OLET), and an orthographic projection region of the OLET on the substrate and an orthographic projection region of the VTFT on the substrate at least partially overlap; and
the plurality of functional layers comprise a gate layer, a first insulating layer, a first electrode layer, a bottom semiconductor material layer, a second electrode layer, a second insulating layer, a first semiconductor material layer, an electroluminescent layer, a second semiconductor material layer, and a source-drain pattern that are sequentially arranged in a direction away from the substrate, the source-drain pattern comprising a source and a drain, and at least one of the source and the drain covers side surfaces of the first semiconductor material layer and the electroluminescent layer; and
the gate layer, the first insulating layer, the first electrode layer, the bottom semiconductor material layer and the second electrode layer constitute the VTFT, and the second electrode layer, the second insulating layer, the first semiconductor material layer, the electroluminescent layer, the second semiconductor material layer and the source-drain pattern constitute the OLET; and
the display substrate further comprises a gate line, a first scanning line, a second scanning line, a first data line and a second data line on the substrate;
the gate line is electrically connected to the gate layer, the first scanning line is electrically connected to the first electrode layer, the first data line is electrically connected to the second electrode layer, the second scanning line is electrically connected to the source in the source-drain pattern, and the second data line is electrically connected to the drain in the source-drain pattern; and wherein the plurality of pixel units are in m rows and n columns, m≥2, n≥2, and the display substrate comprises m oate lines, m second scanning lines and m second data lines that are parallel with a row arrangement direction of the plurality of pixel units, and n first scanning lines and x first data lines that are parallel with a column arrangement direction of the plurality of pixel units, and x is equal to an integer to which a half of n is rounded up;

when n is an even number, n columns of the pixel units constitute x groups of pixel units that are sequentially arranged, and each group of pixel units comprises two columns of pixel units; when n is an odd number, n columns of the pixel units constitute (x−1) groups of pixel units that are sequentially arranged and one group of pixel units adjacent to the (x−1) groups of pixel units, each group of the (x−1) groups of the pixel units comprises two columns of pixel units, and the one group of pixel units comprises one column of pixel units;

the m gate lines and the m rows of pixel units are in one-to-one correspondence, each gate line is electrically connected to the gate layers in the corresponding row of pixel units, and an orthographic projection region of each gate line on the substrate and an orthographic projection region of each pixel unit corresponding to the gate line on the substrate at least partially overlap;

the x first data lines are in one-to-one correspondence with the x groups of pixel units constituted of the n columns of pixel units, each first data line is electrically connected to the second electrode layers in the corresponding group of pixel units, the first data line corresponding to each group of pixel units constituted of two columns of pixel units is between the two columns of pixel units, and the first data line corresponding to the one group of pixel units is at a side, away from the (x−1) groups of pixel units, of the one group of pixel units;

the n first scanning lines are in one-to-one correspondence with the n columns of pixel units, each first scanning line is electrically connected to the first electrode layers in the corresponding column of pixel units, and the first scanning line corresponding to each column of pixel units and the first data line electrically connected to each column of pixel units are at two sides in the row arrangement direction of each column of pixel units;

the m second scanning lines and the m second data lines are in one-to-one correspondence with the m rows of pixel units, each second scanning line is electrically connected to the sources in the corresponding row of pixel units, each second data line is electrically connected to the drains in the corresponding row of pixel units, and the second scanning line and the second data line that correspond to each row of pixel units are at two sides in the column arrangement direction of each row of pixel units.

* * * * *